(12) United States Patent
Dunn et al.

(10) Patent No.: US 11,881,571 B1
(45) Date of Patent: Jan. 23, 2024

(54) THERMAL MANAGEMENT IN BATTERY COMPONENTS

(71) Applicant: Rivian IP Holdings, LLC, Plymouth, MI (US)

(72) Inventors: Casey Taylor Dunn, Mission Viejo, CA (US); Brandon Thayer, Mission Viejo, CA (US); Fwutsai Kuo, Laguna Hills, CA (US); Michael Ryan Tillapaugh, Rancho Mission Viejo, CA (US); Alfredo Gutierrez Estrada, Tustin, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 0 days.

(21) Appl. No.: 18/147,394

(22) Filed: Dec. 28, 2022

(51) Int. Cl.
*H01M 10/613* (2014.01)
*H01M 10/6568* (2014.01)
*H05K 9/00* (2006.01)

(52) U.S. Cl.
CPC ..... *H01M 10/613* (2015.04); *H01M 10/6568* (2015.04); *H05K 9/0064* (2013.01)

(58) Field of Classification Search
CPC ............ H01M 10/613; H01M 10/6568; H05K 9/0064
See application file for complete search history.

(56) References Cited

U.S. PATENT DOCUMENTS

| | | | | |
|---|---|---|---|---|
| 4,158,764 A | * | 6/1979 | Yane | H05B 3/80 219/544 |
| 5,765,761 A | * | 6/1998 | Law | B05B 5/043 239/700 |
| 2017/0335751 A1 | * | 11/2017 | Newman | G01K 13/02 |
| 2019/0221330 A1 | * | 7/2019 | Fuehrer | H01B 7/423 |
| 2020/0375682 A1 | * | 12/2020 | Kincaid | A61B 34/71 |
| 2021/0208011 A1 | * | 7/2021 | Takayasu | H02H 7/001 |
| 2022/0144115 A1 | * | 5/2022 | Hemrle | B60L 53/14 |
| 2023/0084987 A1 | * | 3/2023 | Zoon | B60L 53/18 174/15.1 |
| 2023/0124670 A1 | * | 4/2023 | Oslislok | H01B 7/0266 320/109 |

* cited by examiner

*Primary Examiner* — Muhammad S Siddiquee
(74) *Attorney, Agent, or Firm* — Foley & Lardner LLP

(57) ABSTRACT

Grounding a component, such as a thermal management system, of a battery pack via a coolant is provided. An apparatus can include a body forming a channel to convey coolant within a battery pack. The apparatus can include a conductor electrically coupled to a ground. The conductor can include a lead into the channel to ground the coolant.

20 Claims, 26 Drawing Sheets

THERMAL MANAGEMENT IN BATTERY COMPONENTS

INTRODUCTION

A vehicle, such as an electric vehicle, can be powered by batteries. The vehicle can include a system to manage heat generated at the batteries.

SUMMARY

An aspect of this disclosure is generally directed to techniques for grounding a thermal management system of an electric vehicle via a liquid (e.g., coolant) of the thermal management. A conductor can be disposed within a channel of an apparatus of the thermal management system to make electrical contact with the liquid. The conductor can extend out of the channel to ground the liquid. The portion of the conductor that extends out of the body can be electrically coupled with a ground of the vehicle (e.g., a chassis or frame of the vehicle). The conductor can be electrically coupled to a chassis or frame of the vehicle to ground the conductor. The connector can include at least one component, feature, spike, nail, or roughened surface that clears a non-conductive coating (such as an electro-coat) from a surface of a second apparatus, receiver, or component that the apparatus connects to. By clearing the non-conductive coating, the conductor can make an electrical connection with the second apparatus. The second apparatus can electrically connect with the chassis or frame of the vehicle to ground the thermal system via the liquid.

Because the liquid may flow through thermal components (such as cold plates) that makes electrical connections with batteries or battery modules of a battery pack of the vehicle, grounding the coolant can ground the thermal components, batteries, or battery modules. By grounding the coolant with the connector, only a single point for grounding is needed to ground the thermal system instead of grounding every battery module, every battery, or every thermal component. This single point grounding can reduce or eliminate additional manufacturing steps, reduce manufacturing costs, and improve an assembly processes. Furthermore, the thermal management system can be grounded through a sensor that measures a characteristic or condition of the liquid (e.g., a temperature sensor, a liquid temperature sensor, a thermistor, a thermocouple, a flow rate sensor, a pressure sensor). The sensor can be adapted to include a conductor that makes an electrical connection to a housing of the sensor that is in contact with the coolant. The conductor can make an electrical connection with the vehicle to ground the liquid via the sensor.

At least one aspect is directed to an apparatus. The apparatus can include a body forming a channel to convey liquid within a vehicle. The apparatus can include a conductor. The conductor can electrically couple to a system of the vehicle. The conductor can traverse the channel to ground the system via the liquid.

At least one aspect is directed to an apparatus. The apparatus can include a body forming a channel to convey coolant within a battery pack. The apparatus can include a conductor electrically coupled to a ground. The conductor can include a lead into the channel to ground the coolant.

At least one aspect is directed to a thermal management system. The thermal management system can include a connector. The connector can include a body forming a channel to convey liquid to a thermal component of the thermal management system within a vehicle. The connector can include a conductor. The conductor can be electrically coupled to a component of the vehicle. The conductor can traverse the channel to ground the thermal management system via the liquid.

At least one aspect is directed to a thermal management system. The thermal management system can include a connector. The thermal management system can include a body forming a channel to convey coolant to a thermal component of the thermal management system within a battery pack. The thermal management system can include a conductor electrically coupled to a ground. The conductor can include a lead into the channel to ground the coolant.

At least one aspect is directed to a sensor. The sensor can include a body that extends through an opening into a channel that conveys coolant within a battery pack. The sensor can include a conductor coupled to the body. The conductor can be electrically coupled to a grounded component. The conductor can traverse the channel to ground the system via the coolant.

At least one aspect is directed to a sensor. The sensor can include a body that extends into a channel that conveys coolant within a battery pack. The sensor can include a conductor coupled to the body and electrically coupled to a ground. The conductor can traverse the channel to ground the coolant.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
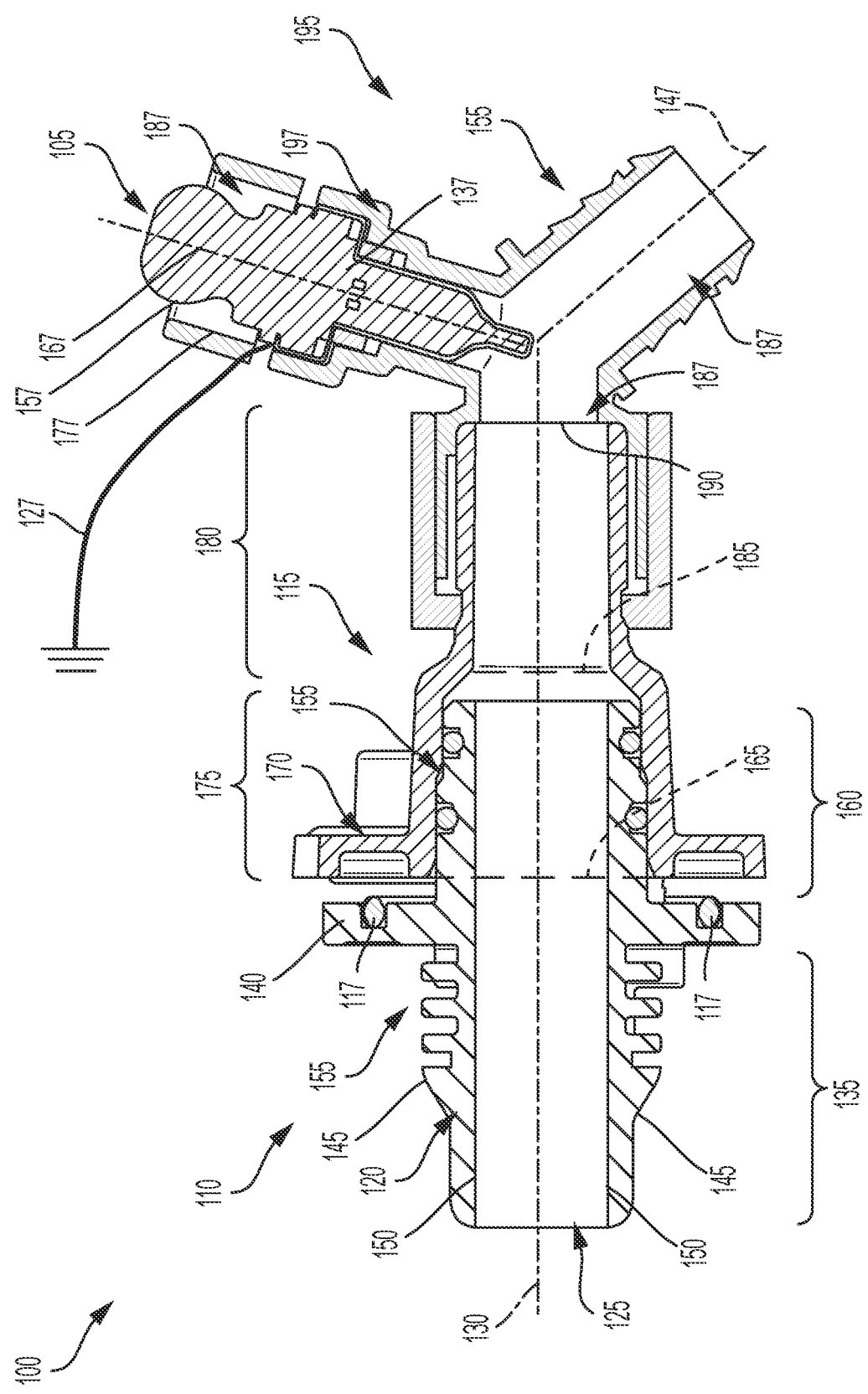
FIG. 1 is an example thermal system of a vehicle including a sensor that grounds the thermal system via a liquid of the thermal system.

Following below are more detailed descriptions of various concepts related to, and implementations of, methods, apparatuses, and systems for thermal management systems, such as a thermal management system for an electric vehicle.

This disclosure is generally directed to techniques for grounding a thermal management system of an electric vehicle. Grounding the thermal management system (e.g., to a chassis or frame of the electric vehicle) can mitigate or reduce the likelihood of an undesired or unintended discharge of electricity, especially if a battery pack of the electric vehicle does not include a negative contactor. Grounding a component to a ground can include electrically coupling the component to another component that is electrically neutral or negative. If the thermal management system is grounded through a battery module, while the thermal management system may be isolated, unintended or undesired discharges of electricity may occur. Furthermore, the thermal management system could include a structure to ground the thermal system through a single cold plate, or multiple cold plates, of the battery pack. However, again, there may be an undesired or unintended discharge of electricity if the system is grounded via the cold plate. Another solution can be grounding a conductive coolant inlet or outlet port of the batter pack. However, the ports may be covered with a nonconductive coating, such as an electro-coat, and therefore the ports may not make a reliable ground connection.

To solve these and other technical challenges, the techniques described herein can ground a liquid or a coolant of the thermal management through a connector (e.g., a bulkhead, a bulkhead fitting, or bulkhead connector). The thermal management system, in-turn, can be grounded by being in electrical connection with the liquid. For example, the connector can include a conductor over-molded into a body of the connector. The conductor can be disposed within a channel of the bulkhead and make contact with the liquid. The conductor can extend out of the channel to ground the liquid. The portion of the conductor that extends out of the body of the bulkhead can be electrically coupled with a ground of the vehicle (e.g., a chassis or frame of the vehicle). The connector can include at least one component, feature, spike, nail, tooth, cutting fin, or roughened surface that clears a non-conductive coating (such as an electro-coat) from a surface of a receiver that the connector connects to. By clearing the non-conductive coating, the conductor or another component of the connector can make an electrical connection with the receiver to ground the thermal system via the liquid. The connector including the conductor can reduce a mass of the thermal management system, reduce manufacturing complexity of the thermal management system, and improve design of the thermal management system.

Because the coolant may flow through thermal components (such as cold plates) that make electrical connections with batteries or battery modules of a battery pack of the vehicle, grounding the coolant can ground the thermal components, batteries, or battery modules. By grounding the coolant with the connector, only a single point of grounding is needed to ground the thermal system instead of grounding every battery module, every battery, or every thermal component. This single point grounding can reduce or eliminate additional manufacturing steps, reduce manufacturing costs, and improve an assembly processes.

Furthermore, the thermal management system can be grounded through a sensor that measures a temperature of the liquid (e.g., a temperature sensor, a liquid temperature sensor, a thermistor, a thermocouple). The sensor can be adapted to include a conductor that makes an electrical connection to a housing of the sensor that is in contact with the coolant. The conductor can make an electrical connection with the vehicle to ground the coolant via the thermistor.

While operations are depicted in the drawings in a particular order, such operations are not required to be performed in the particular order shown or in sequential order, and all illustrated operations are not required to be performed. Actions described herein can be performed in a different order.

Referring now to FIG. 1, a thermal system 100 of a vehicle including a sensor 105 that grounds the thermal system 100 via a liquid or a coolant of the thermal system 100 is shown. The thermal system 100 can be or include a system, an apparatus, a device, a group of devices. The thermal system 100 can include a connector 110 and a receiver 115. The connector 110 can be or include an apparatus, a channel, a pipe, a fitting, a connecting apparatus, a connector apparatus, a bulkhead, a bulkhead connector, a bulkhead fitting. The connector 110 can be located at least partially outside a battery pack of the vehicle to transport, convey, carry, or transmit, a liquid to the battery pack. The flow of the liquid can be reversed, for example, the connector 110 can receive the liquid from the battery pack. The liquid can be a coolant, water, deionized water, a glycol and water solution, a dielectric fluid, or any other liquid that is conductive and can absorb heat generated at components of a vehicle and transport the heat away components. The coolant can be or include a liquid, gas, air, or a mixture of liquid and gas. The connector 110 can include or be formed from a body 120. The body 120 can be a conductive or non-conductive material. For example, the material can include at least one of polymer, aluminum, steel, copper, or rubber.

The body 120 can form a channel 125. The channel 125 can be a cylindrical shape that includes a longitudinal axis 130. The channel 125 can carry, hold, transport liquid through the channel 125 in a direction parallel to or along the longitudinal axis 130. The body 120 can include a first portion 135. The first portion 135 can extend from a wall 140 along the longitudinal axis 130 of the channel 125. The first portion 135 can extend from the wall 140 in a direction away from the receiver 115. The first portion 135 can be a cylindrical shaped portion that includes an outer surface 145. The portion 135 can extend radially from the inner surface 150 to the outer surface 145. The distance that the portion 135 extends radially from the inner surface 150 to the outer surface 145 can be less than a distance that the wall 140 extends from the inner surface 150 to the outer surface 145.

The surface 145 of the portion 135 can include features 155 such as ridges, a roughened surface, spikes, spines, components, or other features. If the portion 135 of the connector 110 is inserted into another component (e.g. a pipe, a channel, a tube) the features or components 155 can apply a force against an inner surface of the component. The frictional force applied by the features 155 can cause the component and the portion 135 of the connector 110 to be coupled, connected, or joined. The coupling can prevent any fluid from leaking from the thermal system 100.

The body 120 of the connector 110 can include a second portion 160. The second portion 160 can be a cylindrical shaped portion that includes an outer surface 145. The second portion 160 can extend from the wall 140 along the longitudinal axis 130. The second portion 160 can extend in a direction away from the first portion 135. The second portion 160 can extend towards the receiver 115. The portion 160 can extend radially from the inner surface 150 to the outer surface 145. The distance that the portion 160 extends radially from the inner surface 150 to the outer surface 145 can be less than a distance that the wall 140 extends from the inner surface 150 to the outer surface 145. The distance that the portion 160 extends radially from the inner surface 150 to the outer surface 145 can be similar to, or the same as, the distance that the portion 135 extends from the inner surface 150 to the outer surface 145.

The second portion 160 can insert through an opening 165 of the receiver 115 into a cavity of the receiver 115. The receiver 115 can include a body 170. The body 170 can be a conductive or non-conductive material. For example, the material can be or include at least one of polymer, aluminum, steel, copper, rubber. The body 170 can form a first portion 175 and a second portion 180. The first portion 175 can extend from the opening 165 along the longitudinal axis to a boundary 185. The boundary 185 can define an opening of the second portion 180. The opening 185 can be smaller than the opening 165. The opening 185 can be circular shaped and have a diameter smaller than a diameter between the outer surface 145 of the second portion 160 of the connector 110. The diameter of the opening 185 can prevent the connector 110 from inserting into the second portion 180 of the receiver 115. The second portion 180 of the receiver 115 can extend in parallel to or along the longitudinal axis 130 of the receiver 115 to an end, edge, boundary, or surface 190 of the receiver 115.

The thermal system 100 can include a connector 195. The connector 195 can be a three way connector, a four way connector, a five way connector. The connector 195 can include a body 197 that forms three channels 187. The second portion 180 of the receiver 115 can extend into a first channel 187. The second portion 180 of the receiver 115 can couple with the receiver 115 via the first channel 187. The sensor 105 can insert or extend into a second channel 187 of the connector 195. A shape of the inner surface 177 of the second channel 187 can conform to a shape of the sensor 105 so that the sensor 105 can be inserted into the second channel 187 and couple with the receiver 115. The sensor 105 can be inserted into the second channel 187 along a longitudinal axis 167 of the second channel 187. Because the inner surface 177 of the second channel 187 can correspond with an outer surface 157 of the sensor 105, a longitudinal axis 167 of the second channel 187 can correspond with the longitudinal axis of the sensor 105. Furthermore, because the outer surface 157 of the sensor 105 corresponds with the inner surface 177 of the channel 187, a seal can be formed between the connector 195 and the sensor 105 such that the liquid cannot flow out of the second channel 187 through an opening of the second channel 187 that the sensor 105 is inserted into.

Liquid can flow along the longitudinal axis 130 of the connector, the longitudinal axis 130 of the receiver 115, and the longitudinal axis 130 of the first channel 187. Because the sensor 105 forms a seal with the second channel 187, the liquid can flow into or out of the third channel 187. The liquid can flow along a longitudinal axis 147 of the third channel. Because at least a portion of the sensor 105 can extend into the connector 195 which forms a channel conveying the liquid, the sensor can measure a characteristic of the liquid. At least a portion of the sensor 105 can be submerged in the liquid. The sensor 105 can measure a temperature of the liquid, a pressure of the liquid, a flow rate of the liquid, or any other characteristic of the liquid.

A body 137 of the sensor 105, or at least a portion of the body 137, can be a conductive material that is submerged in the liquid. The body 137 can be electrically coupled to a conductor 127. The conductor 127 can be or include a wire, a PCB trace, a screw, a bolt, a nut, an enclosure, or any other conductive element or component. The conductor 127 can be electrically coupled with a component (e.g., frame or chassis) of a vehicle to ground the conductor 127 and any component in electrical connection with the conductor 127. The conductor 127 can be coupled to the component of the vehicle to ground the thermal system 100 via the liquid of the channel. The conductor 127 can be electrically coupled, connected, or joined to the body 137 of the sensor 105. The conductor 127 can extend from the sensor 105 and join with another component of the vehicle to ground the conductor 127, the body 137, and the liquid flowing through the connector 195. By grounding the liquid, the entire thermal system 100 in contact with the liquid can be grounded. Furthermore, other components in contact with the thermal system can be grounded. For example, thermal cold plates of the thermal system may be in electrical contact with batteries. Therefore, by grounding the liquid, the cold plates and batteries can be grounded.

The connector 110 can include a component 117. The component 117 can be a seal, a ring, a ring-seal, an o-ring, or any other component that can form a seal between the connector 110 and the receiver 115. The seal 117 can be a ring shaped component that surrounds the channel 125. The seal 117 can contact the connector 110 and the receiver 115 forming a barrier that prevents the liquid from escaping the channel 125 at the junction between the connector 110 and the receiver 115. The seal 117 can be a flexible or elastic. For example, the seal 117 can be or include a plastic or rubber material.

Figure 2:
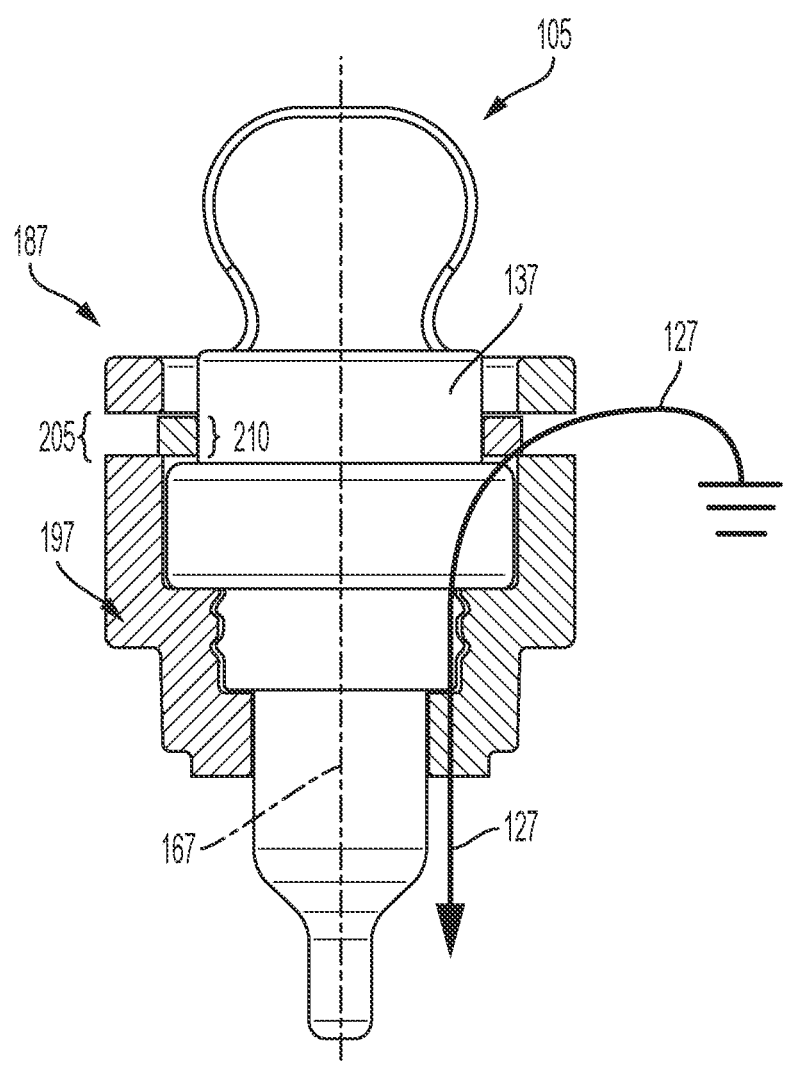
FIG. 2 is an example sensor that includes a conductor that extends through a body of the sensor to electrically couple to a liquid of a thermal system.

Referring now to FIG. 2, the sensor 105 including the conductor 127 extending through the body 137 of the sensor 105 to electrically couple to a liquid of a thermal system is shown. The sensor 105 can be disposed at the inlet of a battery pack. Because the sensor 105 can be submerged in the liquid of the thermal system, the conductor 127 can provide a ground path for the sensor 105. The ground path of the conductor 127 can be a ground path through direct mounting of the sensor 105 to a surrounding enclosure. The ground path of the conductor 127 can be a ground path through a ground of a battery management system (BMS) electronics board of the battery pack. The ground path of the conductor 127 can be a ground path through a BMS ground in a high voltage distribution box (HVDB) of the battery pack, which can avoid the board of the BMS. Grounding the liquid via the sensor 105 can lead to a reduced risk of corrosion. Furthermore, the electronics of the sensor 105 can provide diagnostics and monitoring of the ground connection. However, grounding through the sensor 105 may require additional manufacturing and design resources.

The conductor 127 can be a piece of metal, a wire, an element, or any other conductive component. The conductor 127 can extend through openings, cavities, or holes in the body 137 of the sensor 105 to traverse the body 137 of the sensor 105 and extend into the channel 187 of the connector 195 carrying the liquid to electrically couple with the liquid. A first end, edge, or boundary of the conductor 127 can be located or disposed within the channel 187. The first end of the conductor 127 can be submerged in the liquid, coupled to the liquid, or touching the liquid. The first end of the conductor 127 can be electrically coupled to the liquid. A second end, edge, boundary, or portion of the conductor 127 can be disposed outside of the channel 187 and the body 137 of the sensor 105. The second end of the conductor 127 can electrically couple with a component of a vehicle to ground the thermal system 100 via the liquid of the channel 125. At least a portion of the conductor 127 can be over-molded within the body 137 of the sensor 105. For example, a portion of the conductor 127 between the first end and the second end of the conductor 127. The body 137 can include a channel, an opening, a cavity, or a compartment drilled, molded, or otherwise formed in the body 137. The conductor 127 can be inserted into the channel after the channel is formed.

Figure 3:
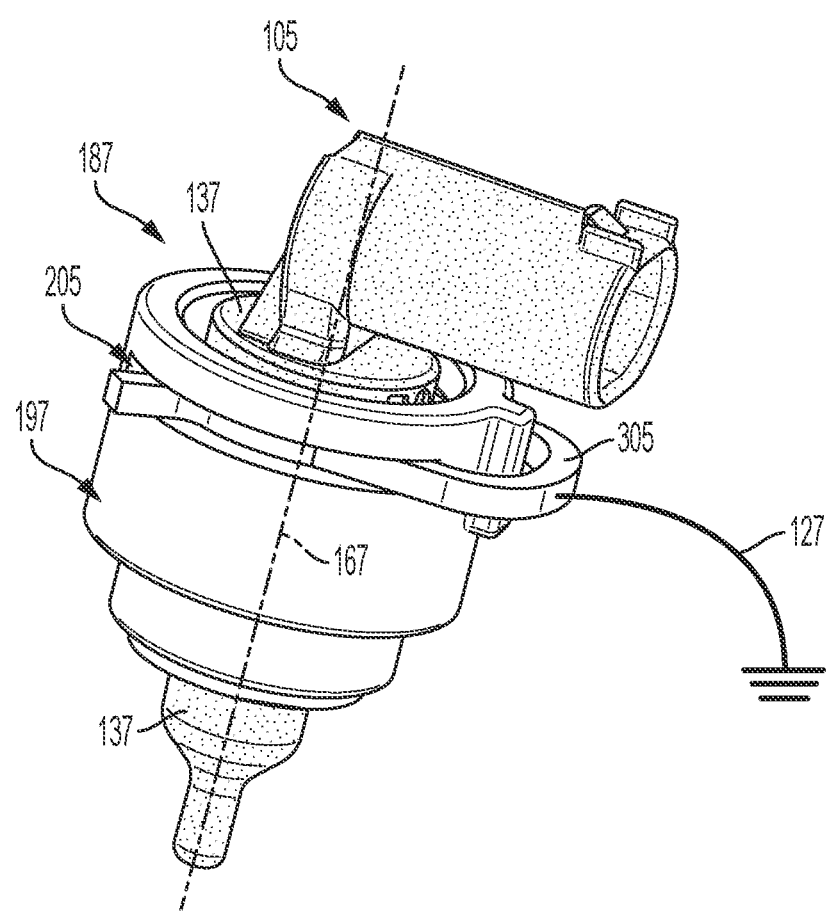
FIG. 3 is an example sensor that includes a retaining clip and a conductor that electrically couples to retaining clip.

Referring now to FIG. 3, the sensor 105 including a retaining clip 305 and a conductor 127 that electrically couples to retaining clip 305 is shown. By grounding the thermal system 100 through the retaining clip 305, little or no design or manufacturing changes may need to be made to the sensor 105. The sensor 105 can be inserted into a body 197, which can be a or include a hole for the sensor 105. The body 197 can be the body of the connector 195, a radiator, a pipe, an engine, or any other component that provides access to liquid within the thermal system. The body 197 can include at least one slot 205. The slot 205 can include an opening between an inner surface of the body 197 and an outer surface of the body 197. The retaining clip 305 can be inserted into the slots 205 of the body 197. Ends of the retaining clip 305 can extend through the slots 205 to make contact with the sensor 105. The sensor 105 can include indents, grooves, or slots 210 that the ends of the retaining clip 305 insert into. The retaining clip 305 can apply a spring force or compression force to the sensor 105 to limit movement of the sensor 105. For example, the retaining clip 305 can limit movement of the sensor 105 along the longitudinal axis. Furthermore, the retaining clip 305 can limit rotation of the sensor 105 along the longitudinal axis. The retaining clip 305 can prevent the sensor 105 from being removed from the channel 187.

The retaining clip 305, when coupled with the sensor 105, can be electrically connected to at least a portion of the body 137 of sensor 105. The retaining clip 305 can be electrically connected to the body 137 of the sensor 105. Because at least a portion of the body 137 is can be conductive and can be electrically coupled to the liquid, the retaining clip 305 can be electrically coupled to the liquid through the body 137 of the sensor 105. The conductor 127 can be fixed, coupled, or connected to the retaining clip 305. At least one end, edge, or portion of the conductor 127 can be coupled to the retaining clip 305 while another end, edge, boundary, or portion of the conductor 127 can ground the thermal system by connecting to a component of the vehicle, e.g., to a frame or chassis of the vehicle.

Figure 4:
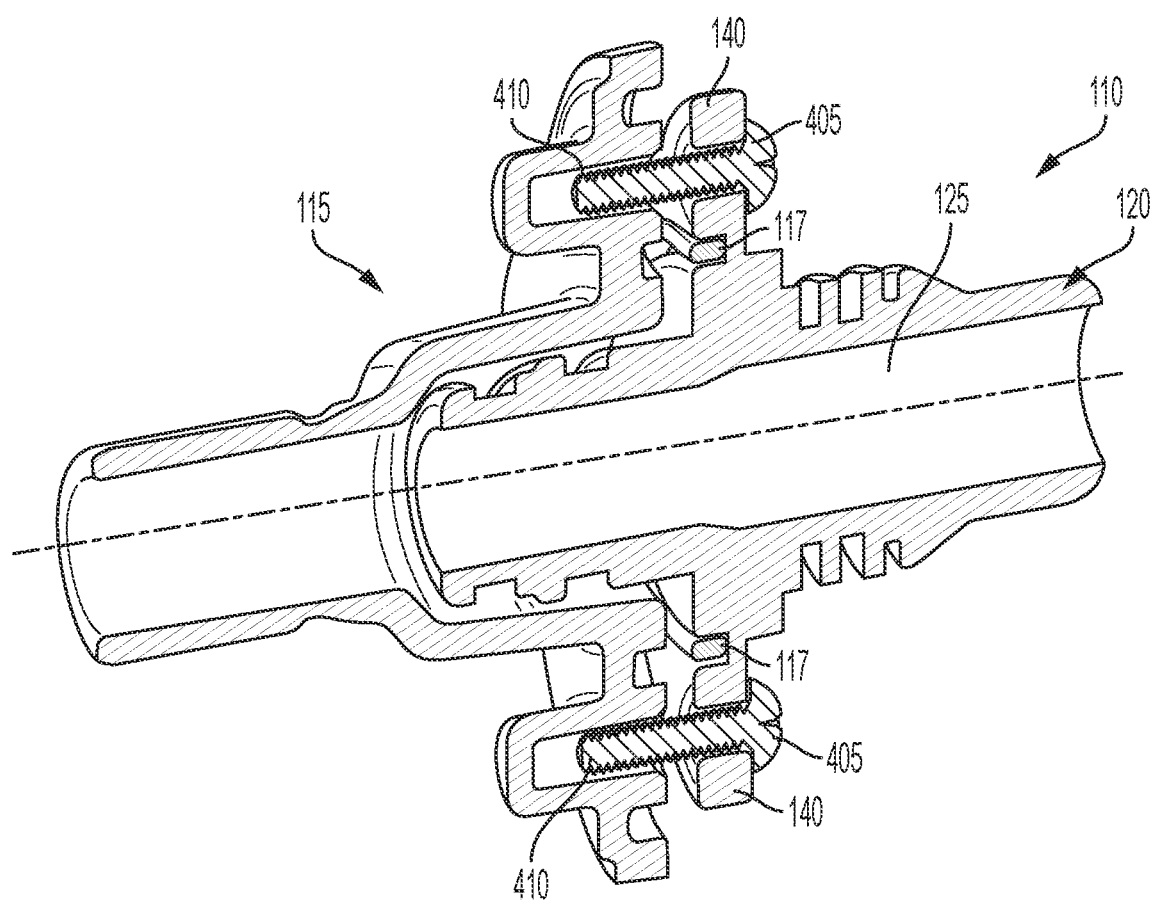
FIG. 4 is an example connector formed from a conductive material that couples with a receiver to ground the thermal system via a liquid conveyed by a thermal system.

Referring now to FIG. 4, the connector 110 formed from a conductive material that couples with the receiver 115 to ground the thermal system 100 via a liquid conveyed by the thermal system 100 is shown. The body 120 of the connector 110 can be formed from a conductive material such as aluminum, iron, steel, copper, or any other conductive material. Because the body 120 is a conductive material, the body 120 can be electrically coupled to the fluid held or conveyed by the channel 125.

The connector 110 can be coupled, fixed, connected, or joined to the receiver 115. The connector 110 can be fixed to the receiver 115 by at least one connecting component 405. The connecting component 405 can be or include a bolt, a washer, a nut, a compression limiter, a clip, a screw, a nail, a connector, or any other component. The connecting component 405 can extend through the wall 140. For example, the connecting component 405 can extend from a first side of the wall 140 to a second side of the wall 140. The connecting component 405 can extend into a cavity 410 of the receiver 115. The cavity 410 can be threaded. The connecting component 405 can be threaded. The connecting component 405 can screw into the cavity 410 to fix the connector 110 to the receiver 115. When the connecting component 405 is screwed into the cavity 410, the connecting component 405 and the cavity 410 can cause a compressing force to be applied between the connector 110 and the receiver 115.

Figure 5:
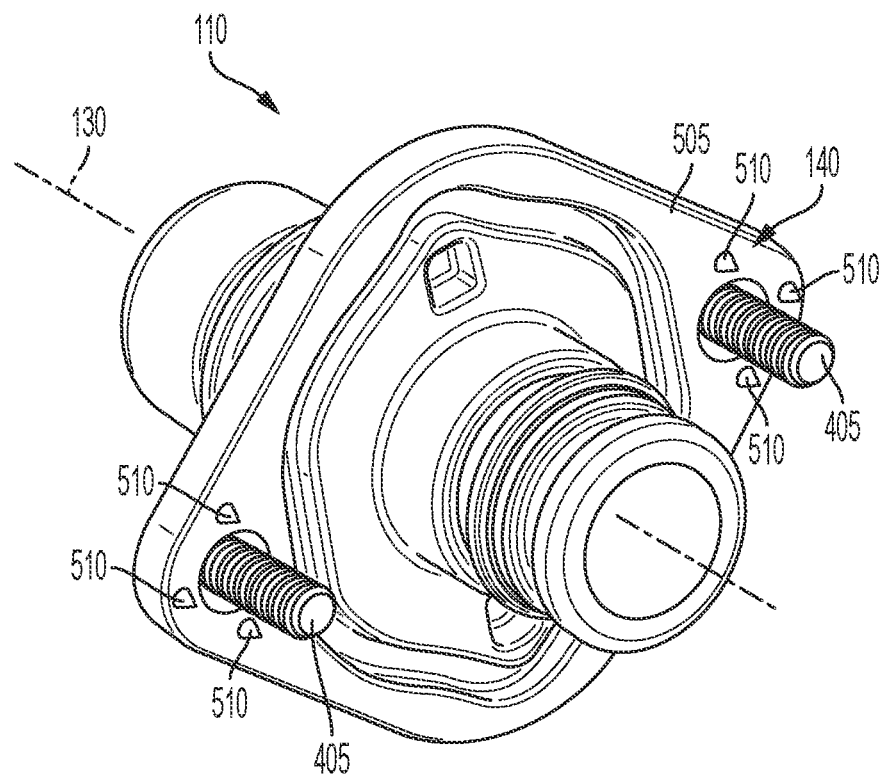
FIG. 5 is an example connector formed from a conductive material that includes features that remove a coating from a receiver when the connector couples with the receiver.
Figure 6:
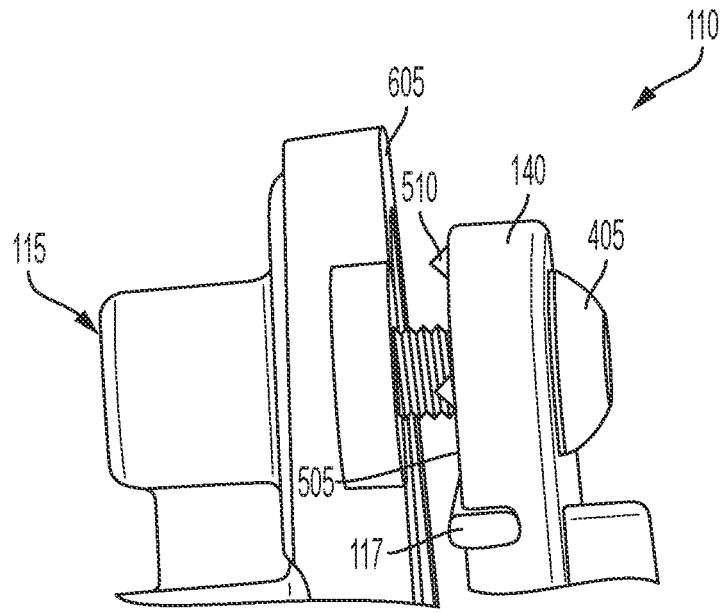
FIG. 6 is an example portion of a connector formed from a conductive material that includes features that remove a coating from a receiver when the connector couples with the receiver.

Referring now to FIGS. 5-6, a connector 110 formed from a conductive material that includes features 510 that remove a coating from the receiver 115 when the connector 110 couples with the receiver 115 is shown. The receiver 115 can be cast in a conductive material. However, the receiver 115 can be covered in a non-conductive coating. For example, the receiver 115 can have an electro-coating applied to an outer surface of the receiver 115. Furthermore, the receiver 115 can be coated with an epoxy, a polyurethane, a polysiloxanes, or a zinc-rich primer. The connector 110 can include the features 510 to remove or clear the coating from the receiver 115. The features 510 can be spikes, cutting spikes, pyramid shaped features, conical sections, prismatic shapes. The features 510 can all be the same shape or all be difference shapes. The features 510 can extend from the wall 140 in a direction along the longitudinal axis 130. The features 510 can extend from a surface 505 of the wall 140. The surface 505 can be a surface of the wall 140 facing the receiver 115.

When the connector 110 and the receiver 115 are coupled, connected, compressed together, pressed together, or joined, the features 510 can remove, clear, or cut through at least a portion of the coating of the receiver 115 or at least a portion of the body 170 of the receiver 115. For example, when the connecting component 405 is screwed into the cavity 410, the features 510 can be pressed or compressed against a surface 605 of the receiver 115. The spikes can remove the coating from the surface 605 of the receiver 115. Through the features 510, the connector 110 can make an electrical connection with the body 170 of the receiver 115 to ground the liquid carried in the thermal system. Via the connecting components 405, the connector 110 can fix to the receiver 115 to electrically couple the conductor 127 with the receiver to ground the thermal system 100.

Figure 7:
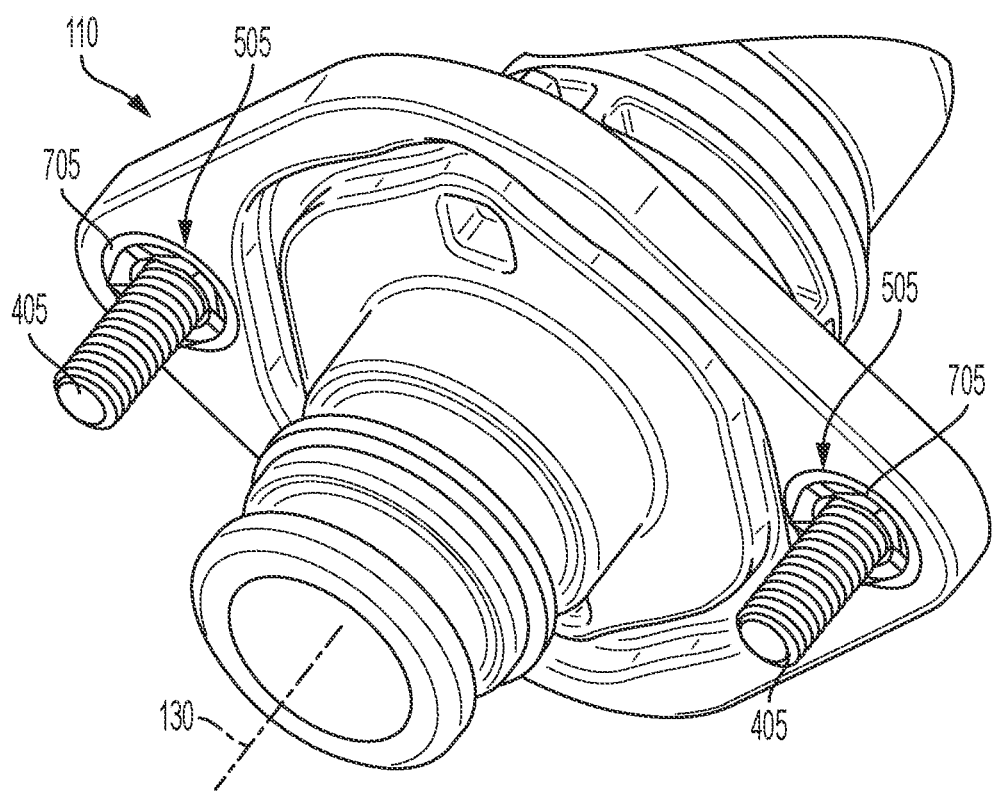
FIG. 7 is an example connector that includes compression limiters that include features to remove a coating from a receiver when the connector couples with the receiver.
Figure 8:
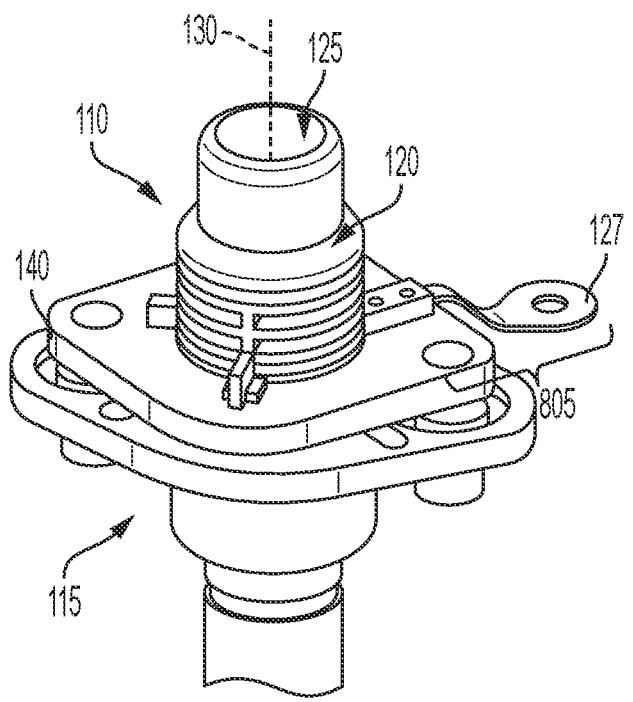
FIG. 8 is an example connector that includes a conductor over-molded in the connector that extends from a body of the connector.
Figure 9:
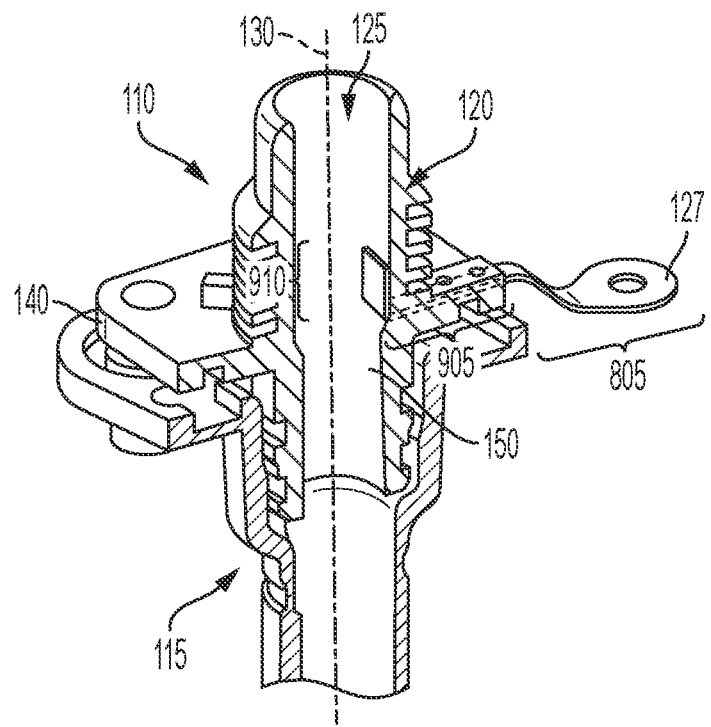
FIG. 9 is a cross-section view of an example connector that includes a conductor over-molded in the connector that extends from within a channel of the connector to outside the body of the connector.
Figure 10:
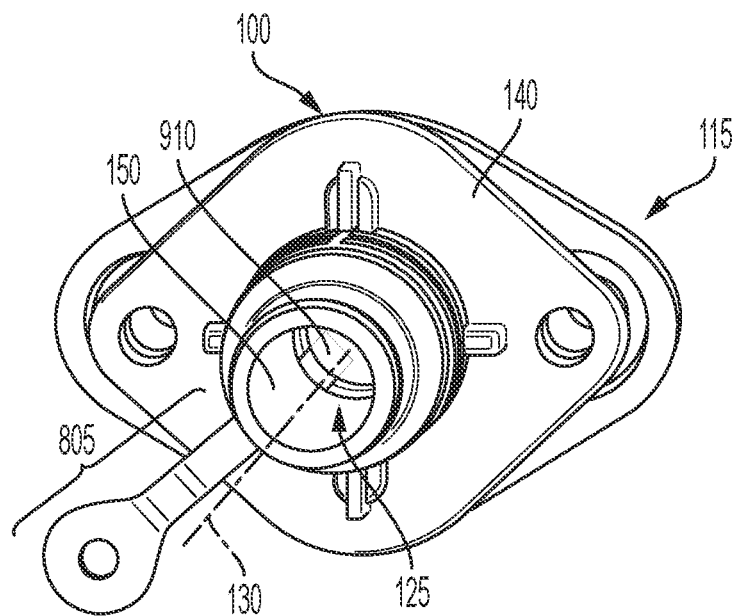
FIG. 10 is another example connector that includes a conductor over-molded in the connector that extends from within a channel of the connector to outside the body of the connector.
Figure 11:
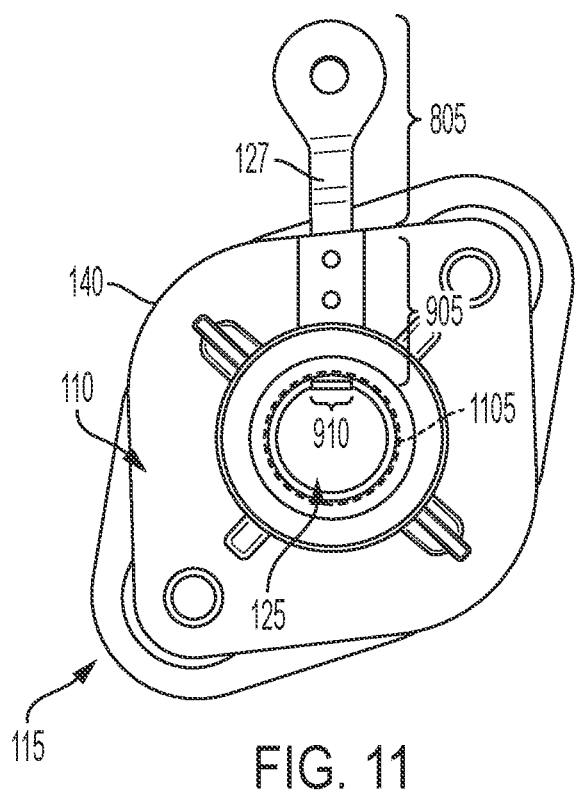
FIG. 11 is another example connector that includes a conductor over-molded in the connector that extends from within a channel of the connector to outside the body of the connector.

Referring now to FIG. 7, a connector 110 including compression limiters 705 that include features 510 to remove a coating from the receiver 115 when the connector couples with the receiver 115 is shown. The compression limiters 705 can be electrically connected, coupled, or joined to the body 120. The compression limiters 705 can limit an amount of compression between the connector 110 and the receiver 115. The compression limiters can include features 510 including a roughened surface, spikes, conical portions, prismatic features, saw-tooth features, pyramid shaped features, fins, cutting edges. The compression limiters 705 can make contact with the surface 605 of the receiver 115 when the connector 110 and the receiver 115 are joined, connected, fixed together, compressed together, pressed against each other. The features 510 of the compression limiter 705 can remove a coating from the surface 605 so that the compression limiter 705 is electrically coupled to the receiver 115. The features 510 of the compression limiters 705 can remove the coating from the surface 605 of the receiver 115 to electrically couple the compression limiters 705 to the receiver 115 to ground the thermal system 100.

Referring now to FIGS. 8-11, the connector 110 including a conductor 127 over-molded in the connector 110 that extends from the body 120 of the connector 110 is shown. The connector 110 can include an over-molded ring terminal conductor 127 that includes a lead into a liquid of the channel 125. The body 120 can be, include, or be formed from a non-conductive material. The non-conductive material can be a polymer. The body 120 can be molded in a mold. The conductor 127 can include a portion 905 over-molded within the body 120 of the connector 110. For example, during the molding process, the conductor 127 can be inserted into the mold and the non-conductive material can be injected or poured into the mold. When the non-conductive material hardens, the conductor 127 can be over-molded in the body 120. For example, the portion 905 of the conductor 127 can be over-molded within the wall 140.

The conductor 127 can include a first portion, end, edge, section, or boundary 805. The first portion 805 of the conductor 127 can extend from the wall 140 to be outside the body 120 of the connector 110. The portion 805 of the conductor 127 can connect with a component that grounds the conductor 127. The portion 805 can be a ring terminal. The portion 805 can include a hole so that the conductor 127 can be fixed by a bolt, screw, nut, nail, or other connector to the component to ground the conductor 127. However, an additional boss may be needed to ground the portion 805.

The conductor 127 can include a portion, end, edge, boundary, or section 910. The portion 910 can extend through the surface 150 of the channel 125 into the channel 125. The portion 910 of the conductor 127 can touch the liquid of the channel 125, be submerged in the liquid of the channel 125, or electrically couple with the liquid of the channel 125. The portion 905 of the conductor 127 can extend radially from the longitudinal axis 130. The portion 910 can extend from an end, edge, or boundary of the portion 905 at an angle along the longitudinal axis 130. For example, the portion 910 and the portion 905 can form a ninety degree angle. The portion 910 and the portion 905 can form a 80-100 degree angle. The portion 910 and the portion 905 can form a 70-110 degree angle. The portion 910 and the portion 905 can form an angle less than 80 degrees. The portion 910 and the portion 905 can form an angle less than 110 degrees. The portion 910 can be flush with the inner surface 150 of the channel 125. The portion 910 can be flat or curved. The portion 910 can be curved to conform with the inner surface 150 of the channel 125.

The channel 125 can include a circumference 1105 formed by the surface 150. The circumference 1105 can be a first circumference or an outer circumference of the channel 125. The portion 910 can extend around a portion of the circumference 1105 of the channel 125. For example, the portion 910 can extend around only a portion of the circumference 1105. The portion 910 can be a curved portion that wraps or curves around only a portion of the circumference 1105. For example, a first arc, section, or portion of the circumference 1105 can be covered by the portion 910 while a second arc, section, or portion of the circumference 1105 can be bare, exposed, or covered by another component other than the portion 910.

Figure 13:
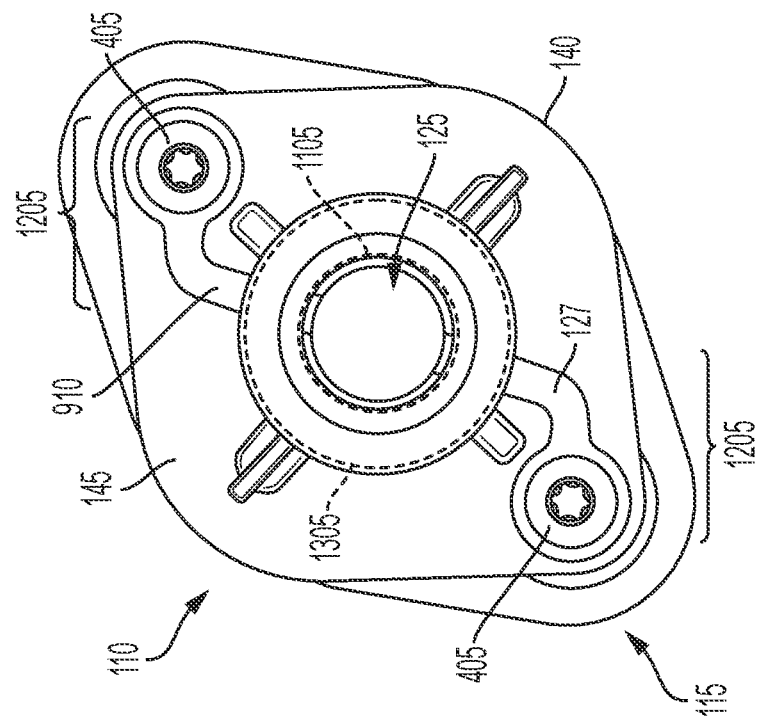
FIG. 13 is another example connector including a conductor that extends from a channel of the connector to a connecting component that fixes the connector to a receiver.
Figure 12:
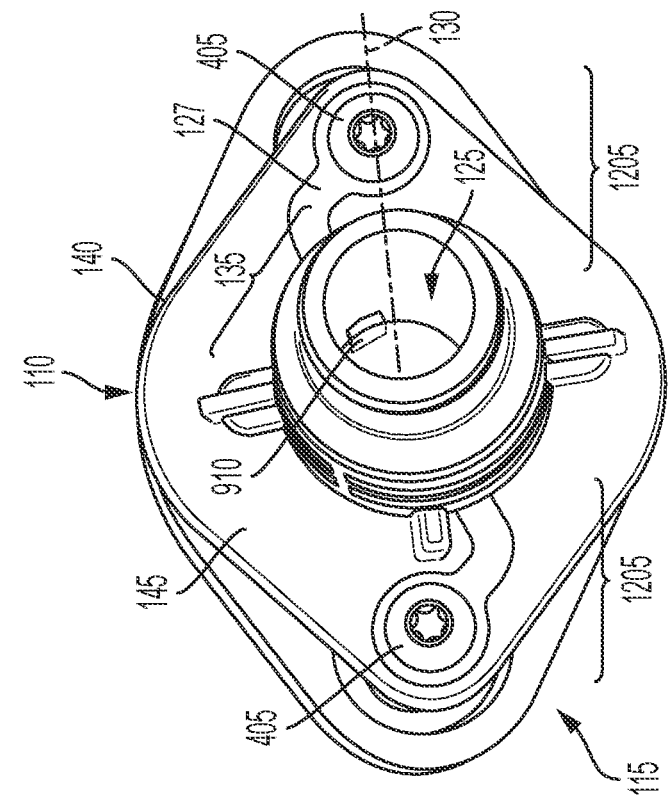
FIG. 12 is an example connector including a conductor that extends from a channel of the connector to a connecting component that fixes the connector to a receiver.

Referring now to FIGS. 12-13 the connector 110 is shown including the conductor 127 extending from the channel 125 to the connecting components 405 that fix the connector 110 to the receiver 115. The connector 110 can include a stamped conductor 127 including a lead into the channel 125 to make contact with a liquid within the channel. The conductor 127 can made electrical connection with compression limiters 705 including cutting teeth 510. The conductor 127 can be over-molded into the body 120, e.g., over-molded into the wall 140 and over-molded into the first portion 135. The conductor 910 can include a first portion, end, edge, boundary, or section 1205 and a second portion, end, edge, boundary, or section 1205 that extend from the connecting components 405 into the channel 125. The portion 1205 can include an eye, a hole, half of a hole, or any other geometry that allows the connecting component 405 to make contact with the connecting component 405 and fix the connecting component 405 to the surface 145 of the wall 140. At least some of the portion 1205 can be over-molded into the wall 140 under the surface 145 and at least some of the portion 1205 can extend out of the surface 145 and be exposed.

The conductor 910 can extend from an outer side of the first portion 135 into the channel 125. For example, the conductor 910 can traverse an outer circumference 1305 of the first portion 135 and the outer circumference 1105 of the channel 125. The outer circumference 1105 of the channel 125 can also be the inner circumference of the first portion 135. For example, the portion 1205 can extend from outside the first portion 135 into the first portion 135, e.g., traversing the outer circumference 1305. Furthermore, the portion 1205 can extend through the first portion 135 into the channel 125, e.g., traversing the circumference 1105.

A portion of the conductor 910 can extend around the circumference 1105 of the channel 125. For example, the conductor 910 can extend around only a portion of the outer circumference 1105 of the channel 125. For example, a first conductor 910 can extend around a first portion, arc, or part of the outer circumference 1105 and a second conductor 910 can extend around a second portion, arc, or part of the outer circumference 1105, and the remaining portions of the outer circumference 1105 can be bare, exposed, or free of the conductor 910.

Figure 15:
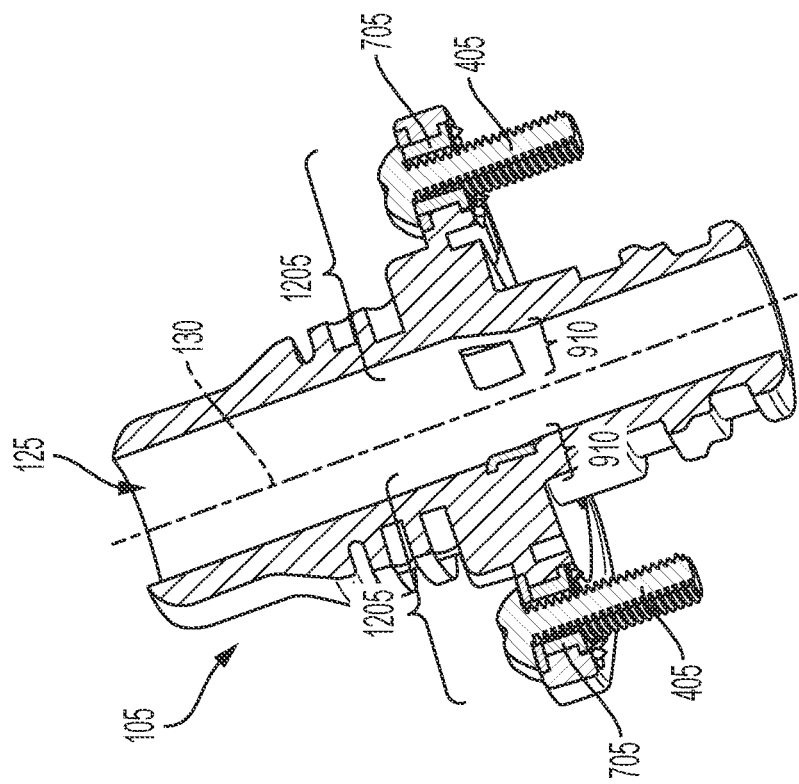
FIG. 15 is another cross-section view of an example connector including compression limiters that electrically couple a conductor over-molded in the connector to a receiver.
Figure 14:
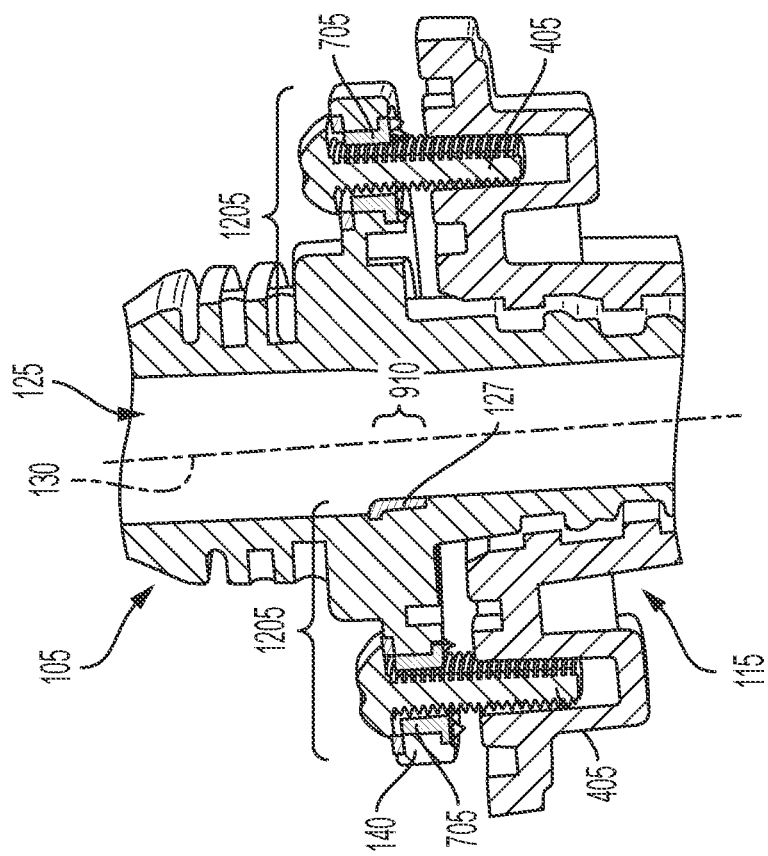
FIG. 14 is a cross-section view of an example connector including compression limiters that electrically couple a conductor over-molded in the connector to a receiver.

Referring now to FIGS. 14-15, cross-section views the connector 110 are shown including the compression limiters 705 that electrically couple the conductor 127 over-molded in the connector 110 to the receiver 115. The conductor 127 can be or include two pieces cast from a conductive material, each including a lead into the channel 125 to make contact with liquid within the channel 125. The two pieces can each make contact with a compression limiter 705 that includes cutting teeth. A first connecting component 405 can insert through an opening or hole in a first portion 1205 of the conductor 127 through an opening or hole in the wall 140. The compression limiter 705 can be inserted into an opening in the wall 140. The compression limiter 705 can be molded into the wall 140. The first connecting component 405 can apply pressure to a surface of the conductor 127 to cause the conductor 127 to make contact with a surface of the compression limiter 705. Because the conductor 127 and the compression limiter 705 make contact, the conductor 127 and the compression limiter 705 can be electrically coupled.

The first portion 1205 of the conductor 127 can be electrically coupled to a first portion 910 of the conductor 127 disposed within the channel 125. The second portion 1205 of the conductor 127 can be electrically coupled to a second portion 910 of the conductor 127 disposed within the channel 125. The first portions 1205 and 910 can be physically separate from the second portions 1205 and 910. The first portions 1205 and 910 and the second portions 1205 and 910 can be electrically coupled through the fluid of the channel 125.

Figure 16:
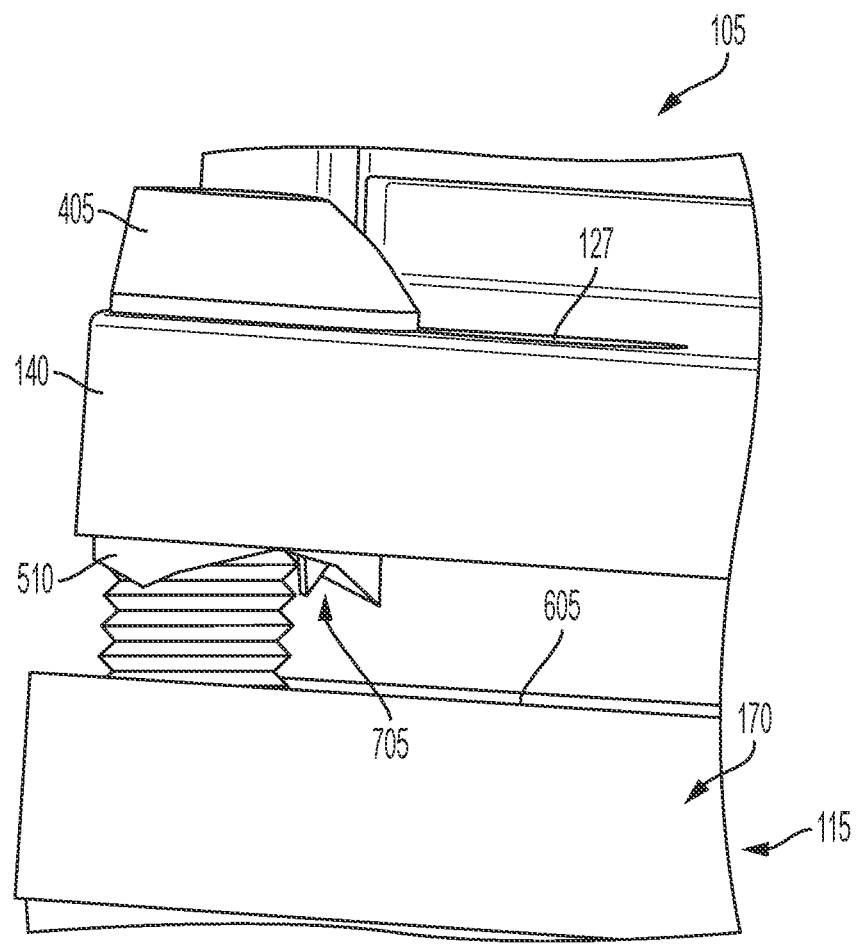
FIG. 16 is an example of a portion of a connector including a compression limiter including features that remove a coating from a receiver to electrically couple a conductor over-molded in the connector to the receiver.

Referring now to FIG. 16, a portion of the connector 110 including the compression limiter 705 including features 510 that remove a coating from the receiver 115 to electrically couple the conductor 127 over-molded in the connector 110 to the receiver 115 is shown. The conductor 127 can be a single casted piece that includes a lead into the channel 125 to make contact with the liquid and also makes contact with two or more compression limiters 705 that include cutting teeth 510. The features 510 of the compression limiter 705 can be or include saw-tooth features, spikes, prismatic features, pyramid shaped features, conical portions, or a roughened surface. The features 510 can include sharp edges or surfaces that come to edges or points. When the connecting component 405 connects the connector 110 to the receiver 115, e.g., applies compression between the connector 110 and the receiver 115, the features 510 can dig into the surface 605 of the receiver, remove portions of the surface 605, or extend into or through the surface 605 of the receiver 115.

The features 510 can electrically couple the compression limiter 705 with the receiver 115 by removing a portion of a coating from the surface 605 of the receiver 115. The coating can be a non-conductive component applied over a conductive material of the receiver 115. For example, the body 170 can be formed from, or include, a conductive material that the features 510 electrically couple with once the features 510 remove the coating. By electrically coupling with the body 170 (which can be grounded), the components electrically coupled to the compression limiter 705 (e.g., the conductor 127 or the fluid in the channel 125 electrically coupled to the conductor 127) can be electrically coupled to the body 170 and grounded through the body 170.

Figure 18:
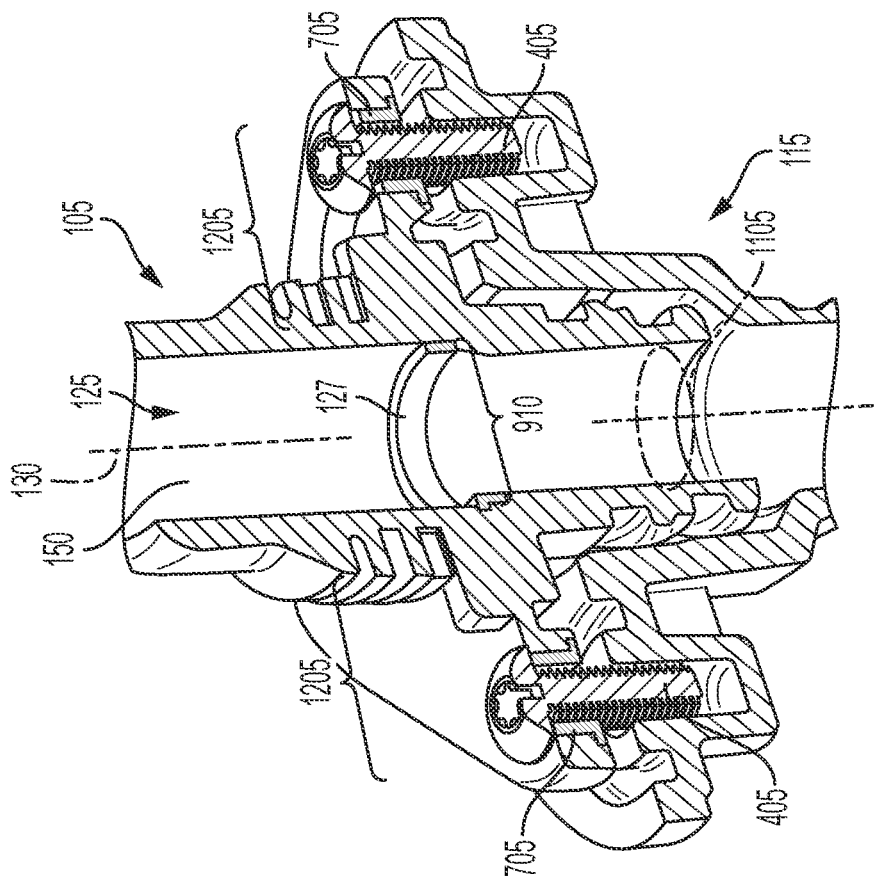
FIG. 18 is a cross-section of another example connector that includes a conductor that extends around a circumference of a surface of a channel of the connector.
Figure 17:
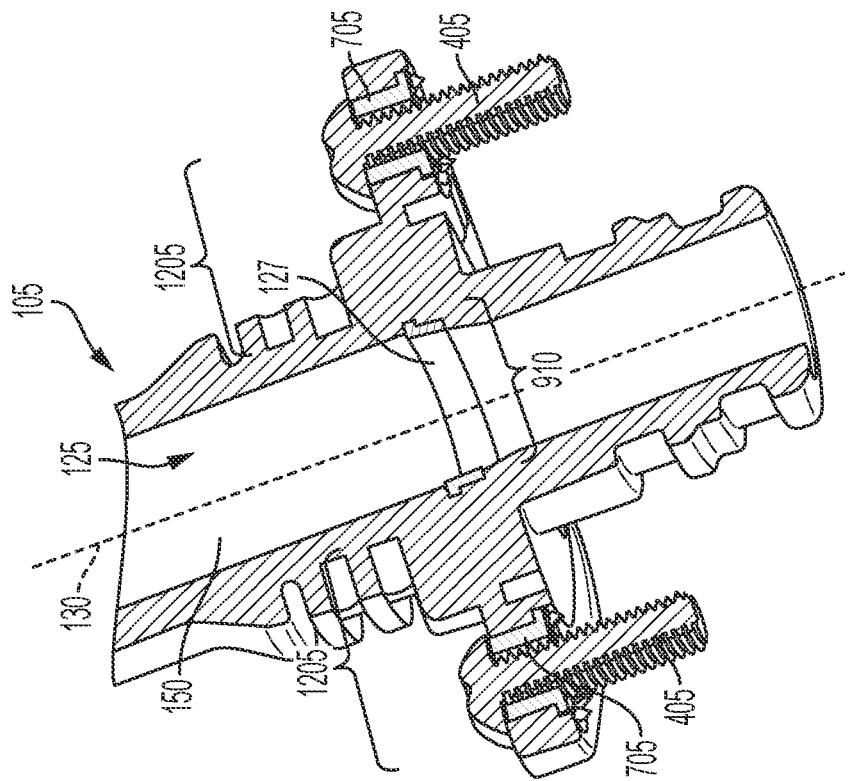
FIG. 17 is a cross-section of an example connector that includes a conductor that extends around a circumference of a surface of a channel of the connector.

Referring now to FIGS. 17-18, a cross-section of the connector 110 including the conductor 127 extending around the outer circumference 1105 of the channel 125 is shown. The connector 110 can include a portion 910 disposed within the channel 125. The portion 910 can be or include a band, ring, hollow cylinder, or curved portion that extends around the circumference 1105. The portion 910 can completely extend around the circumference 1105. The portion 910 can conform to shape of the inner surface 150 of the channel 125, e.g., a circle, oval, curved shape, etc. The portion 910 can make contact with the liquid of the channel 125. The portion 910 of the conductor 127 can be electrically coupled to the liquid of the channel 125. The portion 910 can be physically connected, and electrically coupled, to the first portion 1205 and the second portion 1205. Because the portion 910 extends completely around the circumference 1105, the portion 910 has a large surface area in contact with the liquid and therefore makes a reliable contact with the liquid of the channel 125.

Figure 19:
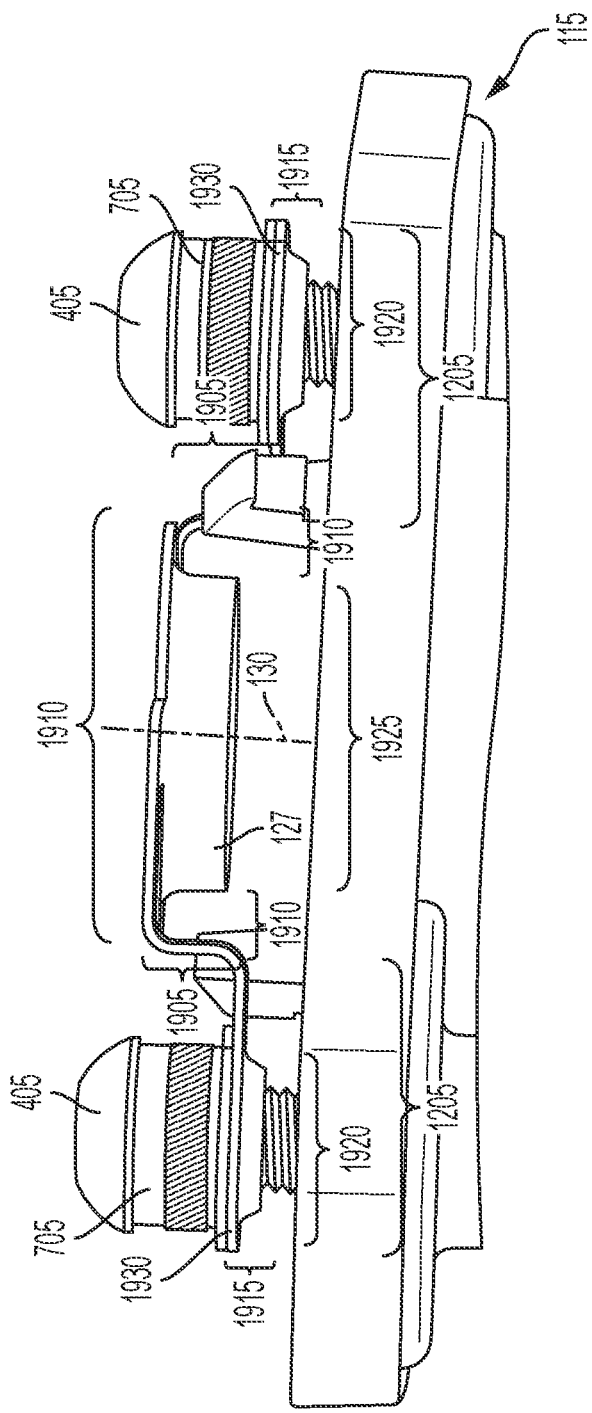
FIG. 19 is an example conductor that electrically couples with connecting components that couple a connector to a receiver.

Referring now to FIG. 19, the conductor 127 electrically coupled with connecting components 405 that couple the connector 110 to the receiver 115 is shown. The portion 910 of the conductor 127 can include a portion 1925 that is disposed within the channel 125 and extends around the circumference 1105 of the channel 125. The portion 910 can be a ring, band, or hollow cylindrical section that extends longitudinally along the longitudinal axis 130 of the channel 125. The portion 910 can include a portion 1910 that is over-molded into the connector 110. The portion 1910 can be a cylindrical shaped portion that extends longitudinally along the longitudinal axis 130. The portion 1910 can extend radially away from the surface 150 of the channel 125 into the body 120 of the connector 110.

At least one arm 1905 conductor 127 can be connected to the portion 1910. The arm 1905 can form a right angle with the portion 1910. The arm 1905 can extend from the portion 1910 along the longitudinal axis 130 towards the receiver 115. The arm 1905 can couple with portion 1205. The portion 1205 can include a portion 1920. The portion 1920 can extend a distance 1915 from a surface 1930 of the conductor 127 towards the receiver 115 along the longitudinal axis 130 of the channel 125. The portion 1920 can include a hole that the connecting component 405 traverses. A radius, circumference, or diameter of the hole can decrease as the portion 1920 extends from the surface 1930 of the conductor 127 towards the receiver 115 the distance 1915 along the longitudinal axis 130 of the channel 125. The radius, circumference, or diameter of the hole can decrease at a constant rate, logarithmic rate, a polynomial rate, etc.

The conductor 127 can include a first portion 1910 connected to the portion 1925. A first arm 1905 can extend from the first portion 1910 and connect to the first portion 1205, which can include a first portion 1920. The conductor 127 can include a second portion 1910 connected to the portion 1925. A second arm 1905 can extend from the first portion 1910 and connect to a second portion 1205, which can include a second portion 1920.

Figure 20:
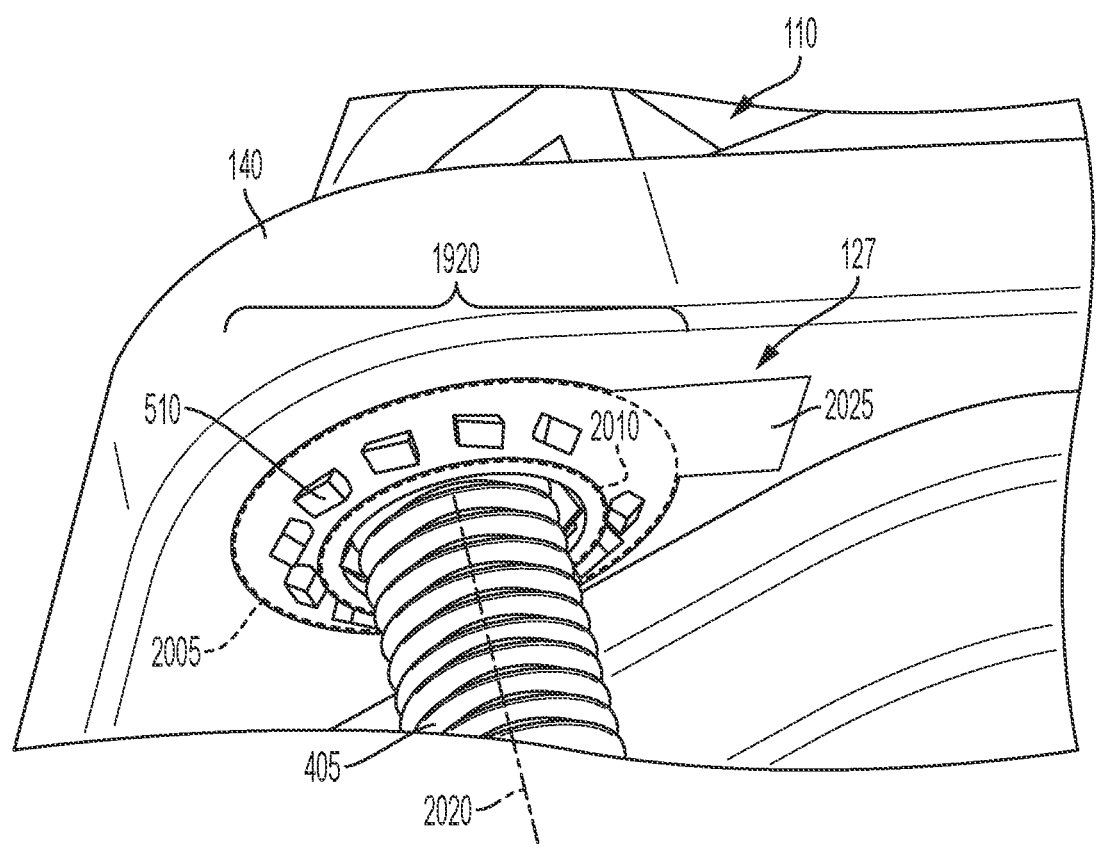
FIG. 20 is an example conductor over-molded in a connector that includes features that extend through the conductor to remove a coating from a receiver when the connector couples with the receiver.

Referring now to FIG. 20, the conductor 127 over-molded in the connector 110 that includes features 510 that extend through the conductor to remove a coating from a receiver when the connector couples with the receiver 115. The connecting component 405 can be a bolt or other component with a cylindrical shaped body. The connecting component 405 can include a longitudinal axis 2020. The longitudinal axis 2020 of the connecting component 405 can be parallel to the longitudinal axis 130 of the channel 125. The portion 1920 can include an opening defined by a circumference 2005 and a circumference 2010. The portion 1920 can be funnel shaped and include two openings, one opening defined by the circumference 2005 that the connecting component 405 inserts into and one opening defined by the circumference 2010 that the connecting component extends out of. The circumference 2005 can be larger than the circumference 2010. The circumference 2010 can be smaller than the circumference 2005. The circumference of the portion 1920 can decrease from the opening defined by the circumference 2005 to the opening defined by the circumference 2010 along the longitudinal axis 2020. The circumference can decrease at a constant rate, logarithmic rate, a polynomial rate, etc. The decreasing circumference can taper the portion 1920 to form a funnel shape.

The conductor 127 can include a bottom surface 2025. The bottom surface 2025 can be parallel with a surface of the receiver 115. The surface 2025 can be perpendicular to the longitudinal axis 2020 (or perpendicular to the longitudinal axis 130). The surface 2025 of the conductor 127 can face towards the receiver 115. The portion 1920 can include at least one opening. A feature 510 of the compression limiter 705 can insert through the openings of the portion 1920 in a direction along the longitudinal axis 2020 past the surface 2025 to be exposed. The features 510 in FIG. 20 are shown to be prismatic shaped features although the features 510 can be spikes, pyramid shaped features, conical sections, or any other type of geometric shape.

The features 510 can be in physical contact with the conductor 127. The features 510 can be electrically coupled with the conductor 127. The features 510 can remove a coating from the receiver 115 and electrically couple the features 510 to the receiver 115. Because the receiver 115 couples with the conductor 127, the liquid of the channel 125 that is electrically coupled with the conductor 127 can be grounded through the receiver 115.

Figure 22:
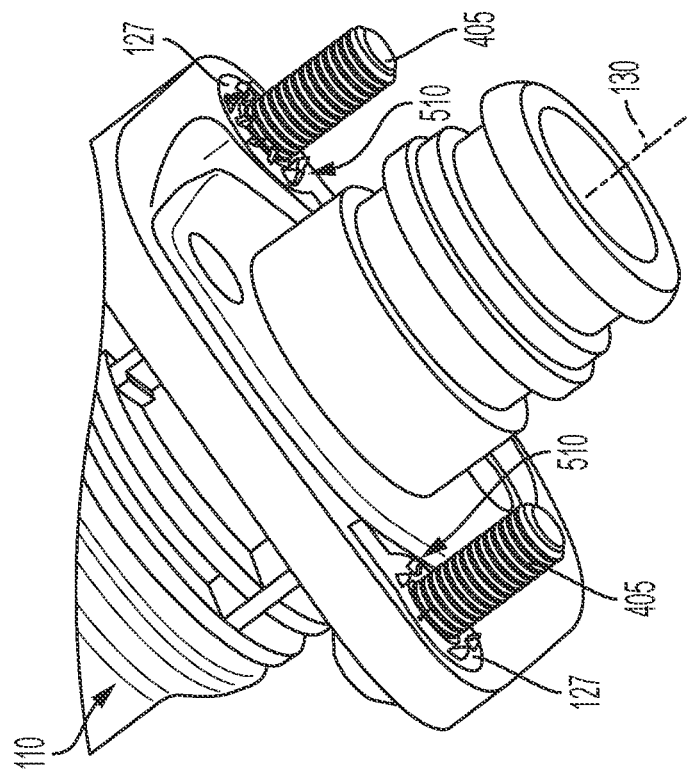
FIG. 22 is another example connector including a conductor that includes features punched from a surface of the conductor to remove a coating from a receiver when the connector couples with the receiver.
Figure 21:
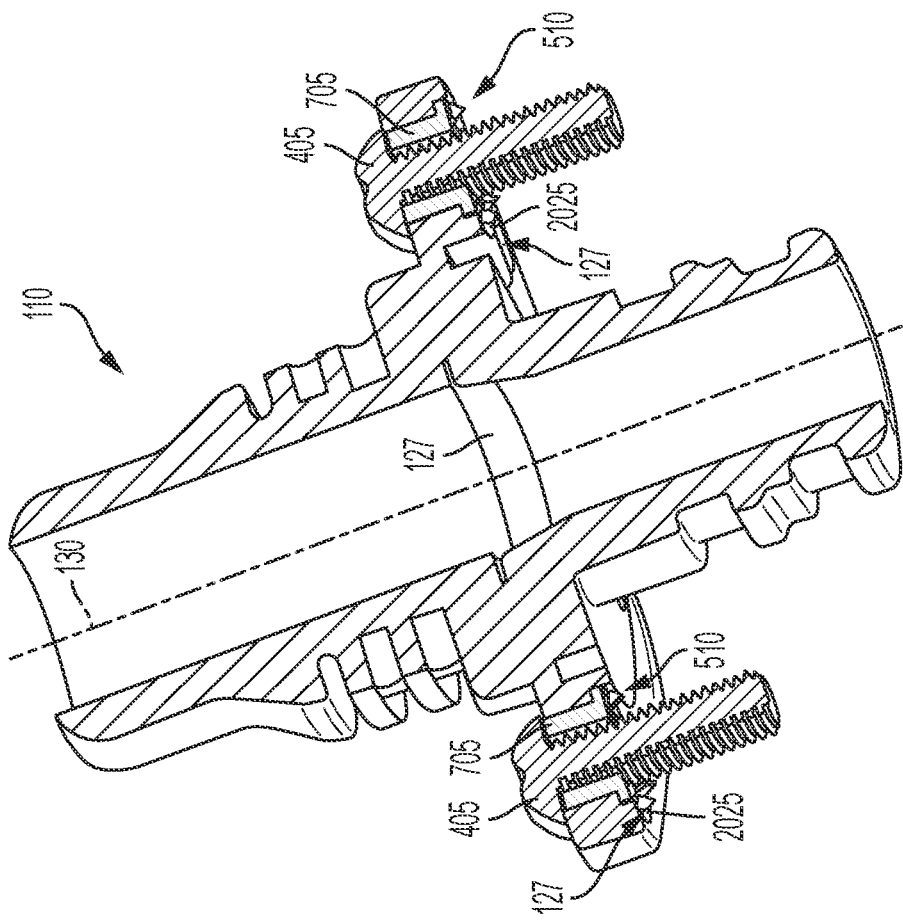
FIG. 21 is an example connector including a conductor that includes features punched from a surface of the conductor to remove a coating from a receiver when the connector couples with the receiver.
Figure 23:
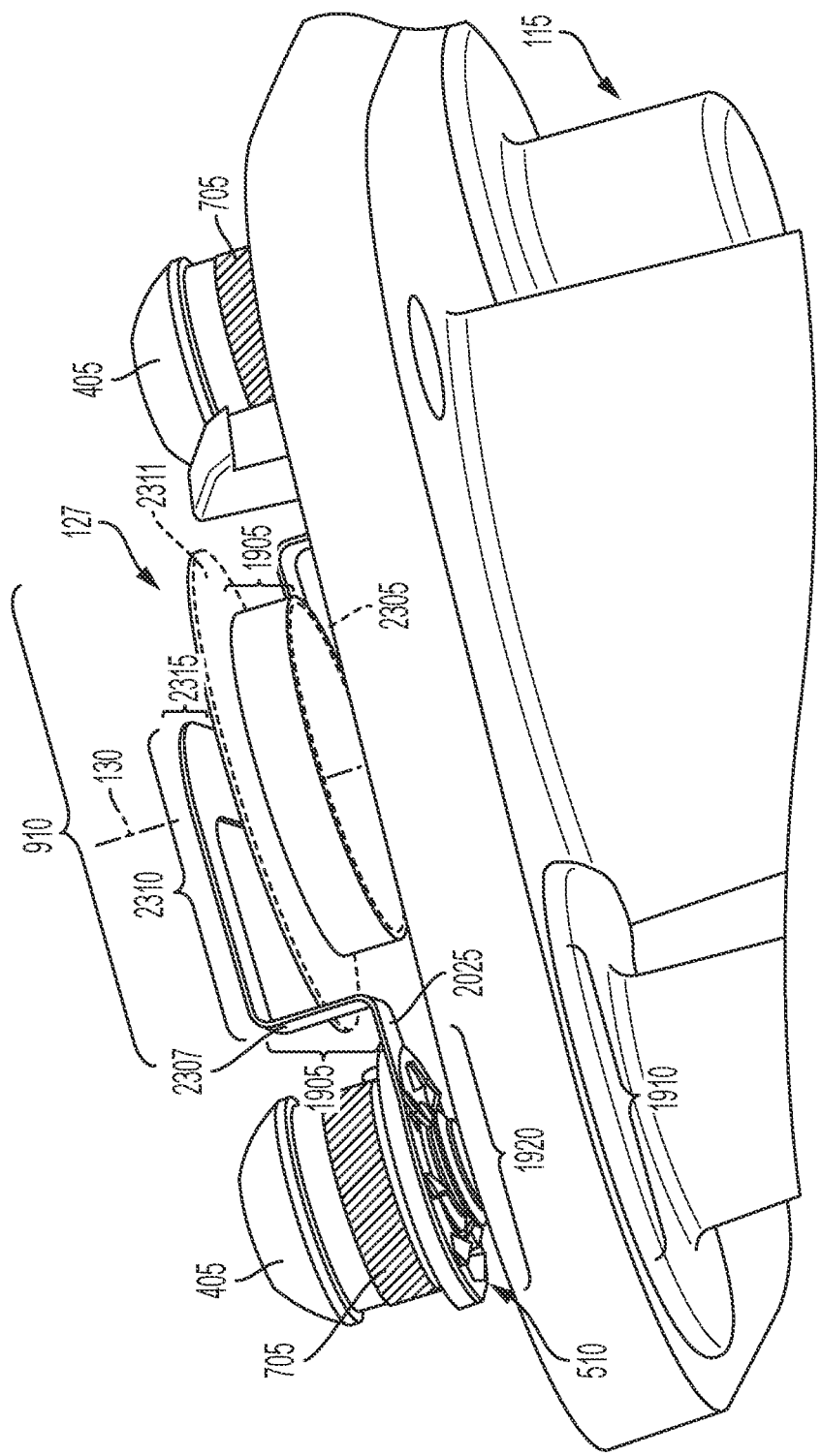
FIG. 23 is an example conductor including features punched from a surface of the conductor to remove a coating from a receiver when a connector couples with the receiver.

Referring now to FIGS. 21-23, the connector 110 including the conductor 127 including features 510 punched from a surface 2025 of the conductor 127 to remove a coating from the receiver 115 when the connector 110 couples with the receiver 115 is shown. The conductor 127 can include features 510 that are punched from the conductor 127. For example, the features 510 can be punched and bent towards the receiver 115. The features 510 can be square shaped, rectangle shaped, triangle shaped. An assembly or manufacturing apparatus can apply pressure to a surface 2307 opposite the surface 2025. The apparatus can cut and bend the feature on at least one side of the feature 510. At least one side, edge, or boundary of the feature may not be cut or punched. This side of the feature 510 can connect the feature 510 to the conductor 127. The feature 510 can bend on this side of the feature 510 towards the receiver 115 in a direction along the longitudinal axis 130. At least one side, edge, or boundary of the feature 510 can be bent away from the surface 2305 and can be free from the surface 2305.

The portion 910 of the conductor 127 includes an opening defined by a circumference 2305. The circumference 2305 can define an inner circumference of the opening, an outer circumference of the opening, an inner or outer circumference of a circular wall forming the opening. The opening of the portion 910 defined by the circumference 2305 can be centered or substantially centered on the longitudinal axis 130. A wall defining the conductor 127 can extend from the opening defined by the circumference 2305 along the longitudinal axis a distance 1905. The wall can extend in a direction away from the opening defined by the circumference 2305 away from the receiver 115. At the end of the distance 1905, the portion 1910 can extend radially away from the longitudinal axis 130. The wall can define a lip, disc, washer-shape with a circumference 2311.

An arm 2315 can extend radially away from the channel 125. The arm 2315 can extend radially away from the longitudinal axis 130. The arm 2315 can extend at a right angle from the channel 125 or at a right angle from the longitudinal axis 130. At an end of the arm 1215, an arm 2310 can extend at a right angle from the arm 2315. The arm 2310 can extend from an end of the arm 2315 in a direction towards the connecting component 405. The arm 2310 can extend in a direction perpendicular to the longitudinal axis 130 or perpendicular to the flow of fluid within the channel 125. At an end of the arm 2310, the arm 1905 can extend. The arm 1905 can extend in a direction perpendicular to the arm 2310. The arm 1905 can extend in a directly parallel to the longitudinal axis 130 or parallel to a direction of flow of fluid within the channel 125. The arm 1905 can extend towards the receiver 115. The portion 1910 can extend from an end of the arm 1905 in a direction perpendicular to the arm 1905 or in a direction perpendicular to the longitudinal axis 130. The portion 1910 can extend towards the connecting component 405.

While the geometry of the conductor 127 is described with respect to the arm 2315, the arm 2310, the arm 1905, and the portion 1910 to connect the conductor 127 to a first connecting component 405, the conductor 127 can include similar, or the same elements on an opposite side of the conductor 127 to connect to a second connecting component 405. The conductor 127 can include any number of the components to connect to any number of connecting components 405.

Figure 24:
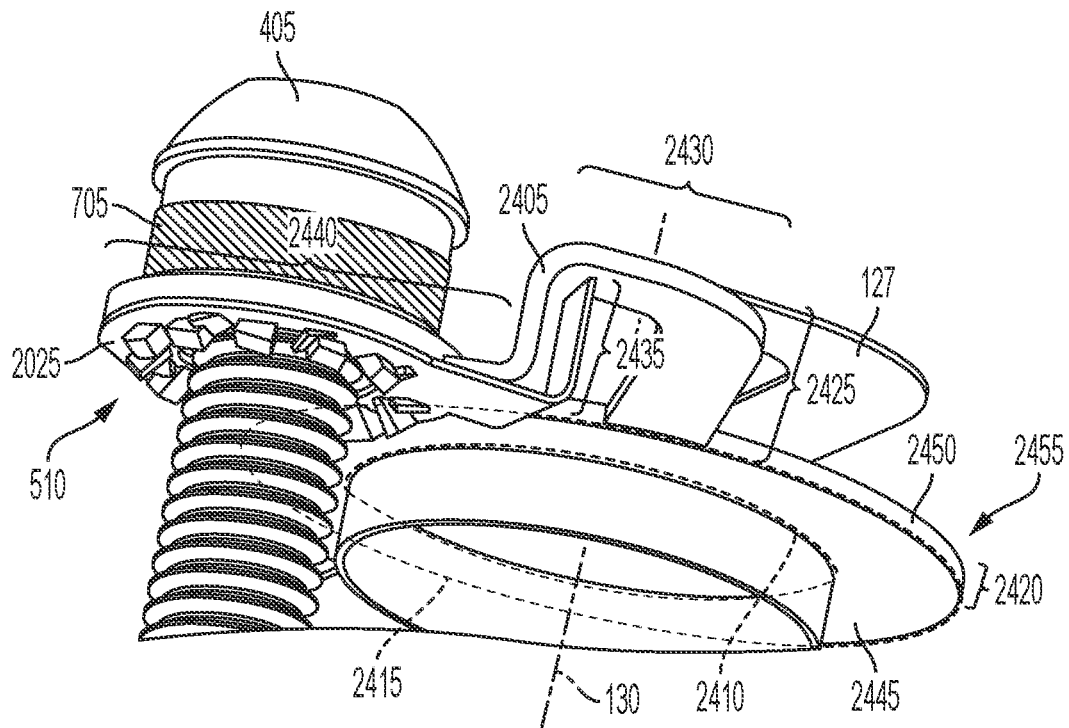
FIG. 24 is an example conductor that includes prismatic features punched from a surface of the conductor and prismatic features that extend through the surface of the conductor.

Referring now to FIG. 24, the conductor 127 including prismatic features 510 punched from a surface of the conductor 127 and prismatic features 510 that extend through the surface of the conductor 127. The connector 110 can include a conductor 2405. The conductor 2405 can be connected to or a part of the conductor 127. For example, the conductor 2405 can be a component of the conductor 127. The conductor 2405 can be electrically coupled to the conductor 127. The conductor 2405 can include an opening defined by an inner circumference 2410. The conductor 2405 can form a disc 2455 surrounding a portion of the conductor 127. The conductor 2405 can extend radially from the inner circumference 2410 to an outer circumference 2415 in a directional perpendicular to the longitudinal axis 130. A portion of the conductor 2405 between the inner circumference 2410 and the outer circumference can have a thickness 2420. The portion of the conductor 2405 between the inner circumference 2410 and the outer circumference can extend the distance 2420 from a surface 2445 facing the receiver 115 to a surface 2450 opposite the surface 2445. The distance 2420 between the surface 2445 and the surface 2450 can be constant or can vary.

The conductor 2405 can include an arm 2425 that extends from the conductor 2405 on the outer circumference 2415 of the conductor 2405. The arm 2425 can extend at an angle perpendicular to the longitudinal axis 130 or perpendicular to the outer circumference 2415. The arm 2425 can extend in a direction away from the channel 125 or away from the longitudinal axis 130. One end of the arm 2425 can be coupled to the outer circumference 2415 and another end of the arm 2425 can be coupled to a second arm 2430. The second arm 2430 can extend at an angle perpendicular to the longitudinal axis 130, perpendicular to the arm 2425, or perpendicular to a direction of flow of fluid within the channel 125. A first end of the arm 2430 can be coupled to the arm 2425 while a second end of the arm 2430 can be coupled to the arm 2405.

The arm 2405 can extend from an end of the arm 2430 at an angle perpendicular to the arm 2430. The arm 2405 can extend in a direction parallel with the longitudinal axis 130 or in a direction parallel to the flow of fluid within the channel 125. The arm 2405 can extend in a direction towards the receiver 115. An end of the arm 2405 can be coupled with an end of the arm 2430. Another end of the arm 2405 can be coupled with an end of the portion 2440. The portion 2440 can extend from the end of the arm 2405 at an angle perpendicular to the arm 2405 or at an angle perpendicular to the longitudinal axis 130. The arm 2405 can extend towards the connecting component 405. The arm 2405 can include a funnel shape that includes features 510.

While the geometry of the conductor 2405 is described with respect to the arm 2425, the arm 2430, the arm 2435, and the arm 2440 to connect the conductor 2405 to a first connecting component 405, the conductor 2405 can include similar, or the same elements on an opposite side of the conductor 2405 to connect to a second connecting component 405. The conductor 127 can include any number of the components to connect to any number of connecting components 405.

The arm 2440 can include features 510. The features 510 can extend through openings in the conductor 127. Furthermore, the conductor 127 can include features 510 punched from the surface 2025. By including two separate types of features 510, the conductor 127 and the conductor 2405 can reliably remove a coating from the receiver 115 and make a reliable electrical connection to the receiver 115.

Figure 25:
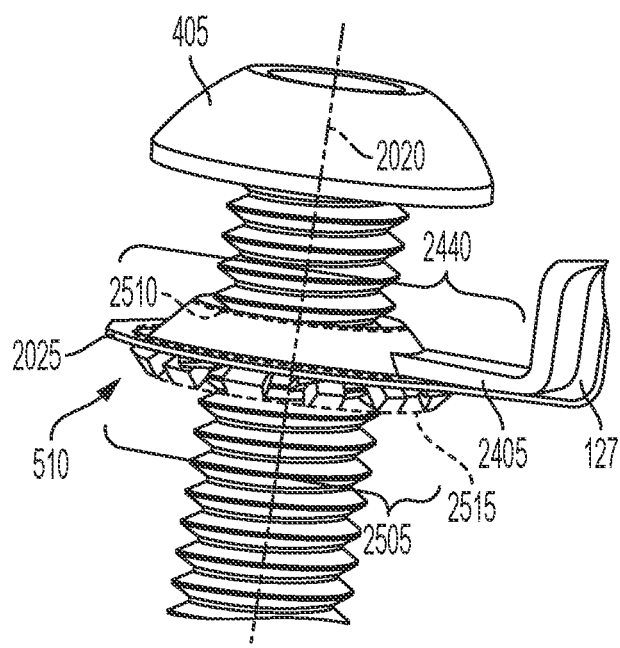
FIG. 25 is another example conductor that includes prismatic features punched from a surface of the conductor and prismatic features that extend through the surface of the conductor.

Referring now to FIG. 25, the conductor 127 including prismatic features 510 punched from a surface of the conductor 127 and prismatic features 510 that extend through the conductor 127. The arm 2440 can include a funnel 2505. The funnel 2505 can be positioned such that a small end is closer to a head of the connecting component 405 and a larger end is closer to the receiver 115. The funnel 2505 can include an opening defined by a first circumference 2510. The first circumference 2510 can define an opening of the funnel 2505 that the connecting component 405 is inserted into. The funnel 2505 can include a second opening defined by the circumference 2515. The second opening defined by the circumference 2515 can be an opening that the connecting component 405 extends out of.

The funnel 2505 can include a circumference, diameter, or radius that increases along the longitudinal axis from the circumference 2510 to the circumference 2515. The circumference, diameter, or radius can increase at a constant rate from the circumference 2510 to the circumference 2515. The opening of the funnel 2505 defined by the circumference 2515 can include features 510 that remove a coating from the receiver 115. The features can be prismatic shaped features. The features 510 can be defined by free areas between features 510. The free areas can be prismatic shapes.

Figure 26:
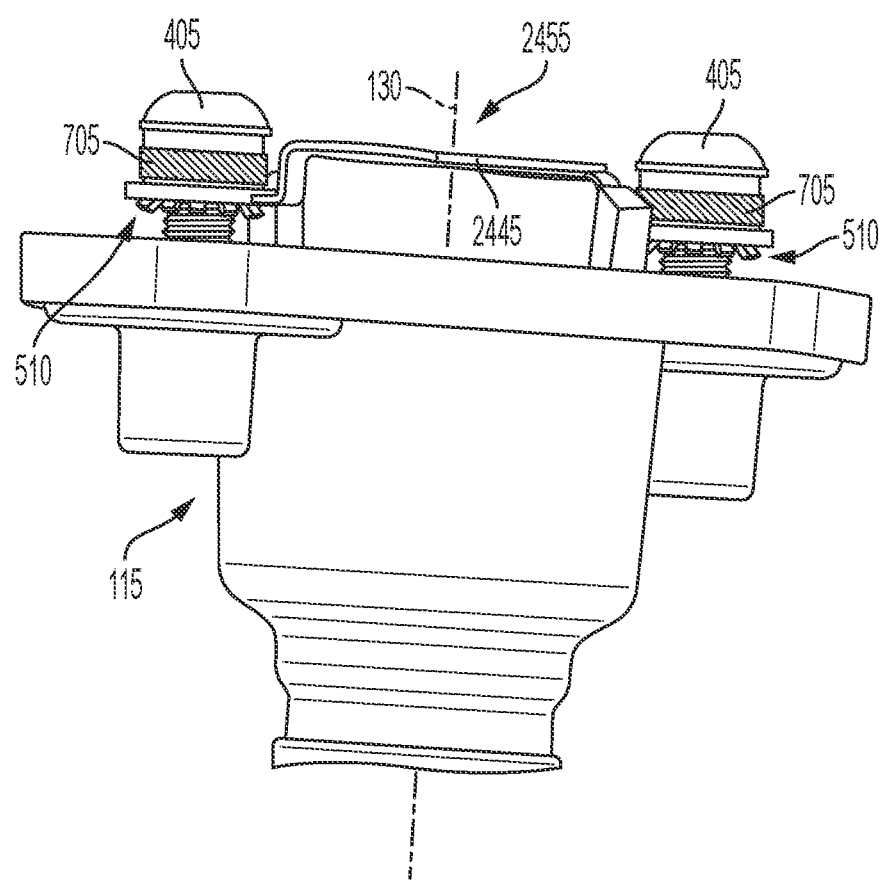
FIG. 26 is an example portion of a conductor that includes prismatic features that extend through a surface of another portion of the conductor.

Referring now to FIG. 26, the conductor 2405 that includes prismatic features that extend through the surface 2025 of the conductor 127 is shown. The conductor 2405 is coupled at a first end to a first connecting component 405 and coupled at a second end to a second connecting component 405. Although the conductor 2405 is shown to be coupled to two connecting components 405, the conductor 2405 can couple to one, two, three, or any number of connecting components 405. The conductor 2405 can include one or multiple arms that connect the disc 2455 to each of the connecting components 405.

Figure 27:
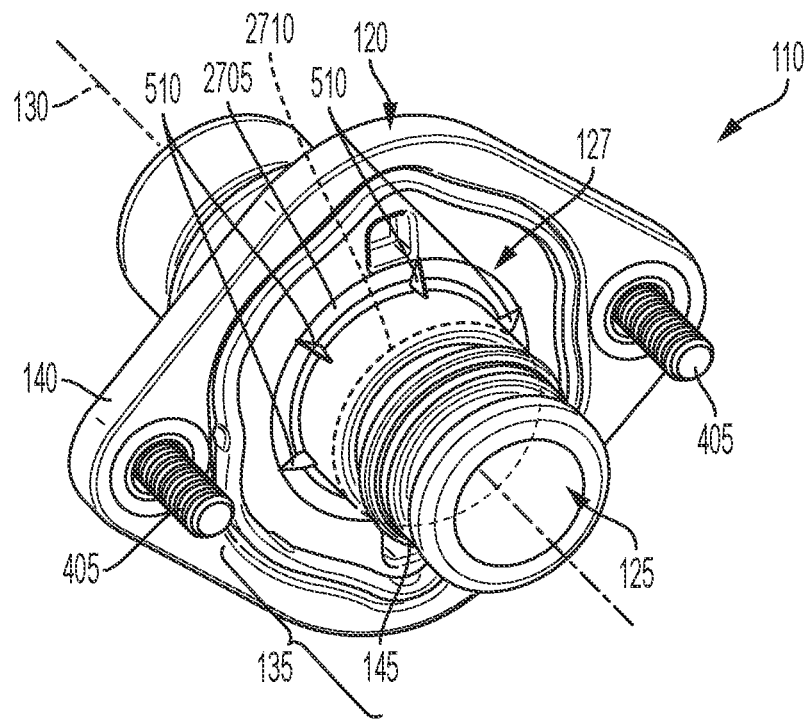
FIG. 27 is an example connector that includes a conductor that extends through a cylindrical portion of the connector.
Figure 28:
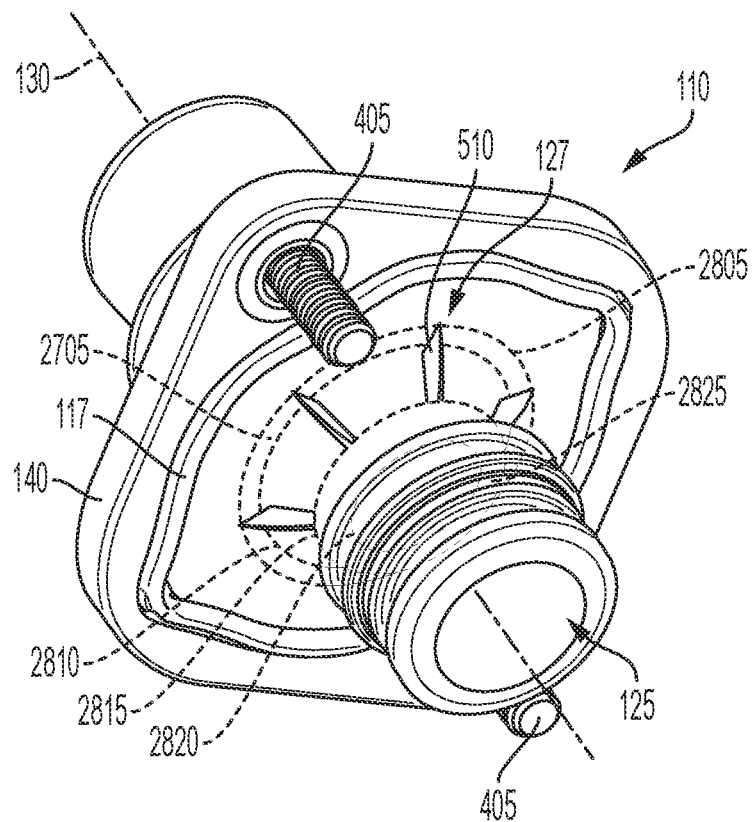
FIG. 28 is another example connector that includes a conductor that extends through a cylindrical portion of the connector.
Figure 29:
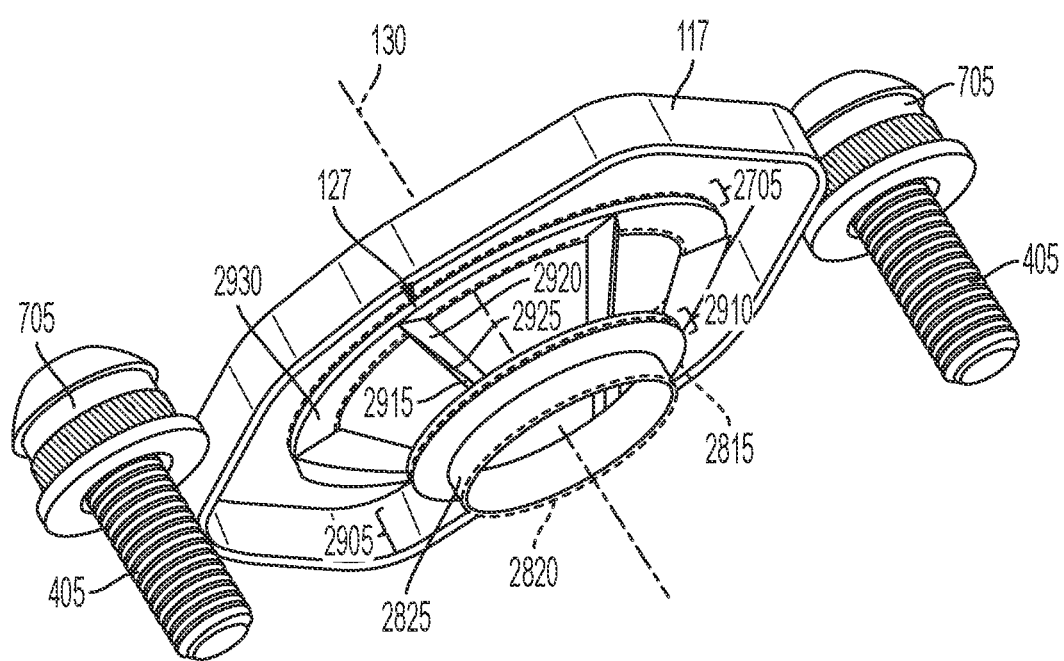
FIG. 29 is an example conductor that extends through a cylindrical portion of the connector.

Referring now to FIGS. 27-29, the connector 110 that includes a conductor 127 that extends through the cylindrical portion 135 of the connector 110 is shown. At least a portion of the conductor 127 can be disposed within the channel 125 and be in contact with, submerged in, or coupled to, liquid within the channel 125. At least a portion of the conductor 127 can extend radially from the channel 125 through the portion 135 out of the body 120 of the conductor 127. The conductor 127 can include features 510 that extend out of the body 120. The features 510 can remove a coating from the receiver 115 when the connector 110 is coupled to the receiver 115. At least a portion of the conductor 127 can be over-molded into the body 120 of the connector 110, e.g., into the portion 135 of the connector 110.

The conductor 127 can include a disc, component, portion, or section 2705. The disc 2705 can include an outer circumference 2805 and an inner circumference 2810. The outer circumference 2805 of the disc 2705 can be greater than the inner circumference 2810. The outer circumference 2805 can be greater than an outer circumference 2710 of the section 135 of the connector 110. The inner circumference 2810 of the disc 2705 can be the same as the outer circumference 2710 of the section 135. The inner circumference 2810 of the disc 2705 can be slightly larger than the circumference 2710 of the section 135 such that the disc 2705 can extend around an outer surface of the section 135. The disc 2705 can extend radially from the longitudinal axis 130 at an angle perpendicular to the longitudinal axis 130. For example, the disc 2705 can extend from the inner circumference 2810 to the outer circumference 2805 at an angle perpendicular to the longitudinal axis 130.

Furthermore, the wall 140 can extend from the outer circumference 1105 of the channel 125 or the circumference 2710 of the portion 135 a first distance. The wall 140 can extend from the circumference 1105 of the channel 125 or the circumference 2710 of the portion 135 the first distance in a direction perpendicular to the longitudinal axis 130. The conductor 127 can extend from within the channel 125 radially outwards to the circumference 2805. The conductor 127 can extend from the outer circumference 1105 of the channel 125 or the circumference 2710 of the portion 135 a second distance in a direction perpendicular to the longitudinal axis 130. The first distance that the wall 140 extends can be greater than the second distance that the conductor 127 extends. The second distance that the conductor 127 extends can be less than the first distance that the wall 140 extends.

The conductor 127 can include a disc, component, portion, or section 2825. The disc 2825, or a portion of the disc 2825, can be disposed within the channel 125 and in contact with the fluid of the channel 125. A portion of the disc 2825 can be over-molded into the section 135. The disc 2825 can include an opening defined by the circumference 2820. The disc 2825 can extend in a direction parallel to the longitudinal axis 130 from the opening defined by the circumference 2820 away from the receiver 115. The disc 2825 can extend a distance over a section 2905 from the circumference 2820. The disc 2825 can extend the distance over the section 2905 with a constant circumference, e.g., the circumference 2820. A section 2910 of the conductor 127 can extend from an end of the section 2905 at a circumference 2815. The circumference 2815 can be greater than the circumference 2820. The section 2910 can extend in a direction perpendicular to the longitudinal axis 130 from inside the channel 125 into the body 120 of the section 135.

Features 510 can extend from the portion 2910 to the disc 2705. The features 510 can extend through the body 120 of the section 135. The features 510 can extend through the body 120 and across the surface 145 to be exposed on an outer side of the surface 145. The features 510 can be fins, cutting fins, or triangular prisms. One feature 510 can include a surface 2915 and a surface 2920. The surfaces 2915 and 2920 can extend from a back wall to an edge 2925. The edge 2925 can be a sharp edge that can cut through a coating of the receiver 115 and cut at least partially into the receiver 115 to electrically couple the conductor 127 to the receiver 115. The feature 510 can extend from the portion 2910 to couple with a bottom surface 2930 of the disc 2705. The bottom surface 2930 can face the receiver 115.

The features 510 can apply a substantial amount of pressure to the receiver 115 ensuring that a nonconductive coating of the receiver 115 is received, cut, or cleared. The conductor 127 can require less parts since the conductor 127 may not need specialized compression limiters or fasteners. Furthermore, the conductor 127 embedded within the first portion 135 (e.g., a bulkhead pass) can be readily manufactured. The conductor 127 can include multiple triangular prism features 510. The triangular prism features 510 can be arranged spoke-like around the disc 2705 and the disc 2825. The features 510 can be equally spaced such that an arc length between each feature 510 is equal. However, the features 510 can be spaced unequally such that there are at least unequal arc lengths that separate at least some of the features 510.

Figure 30:
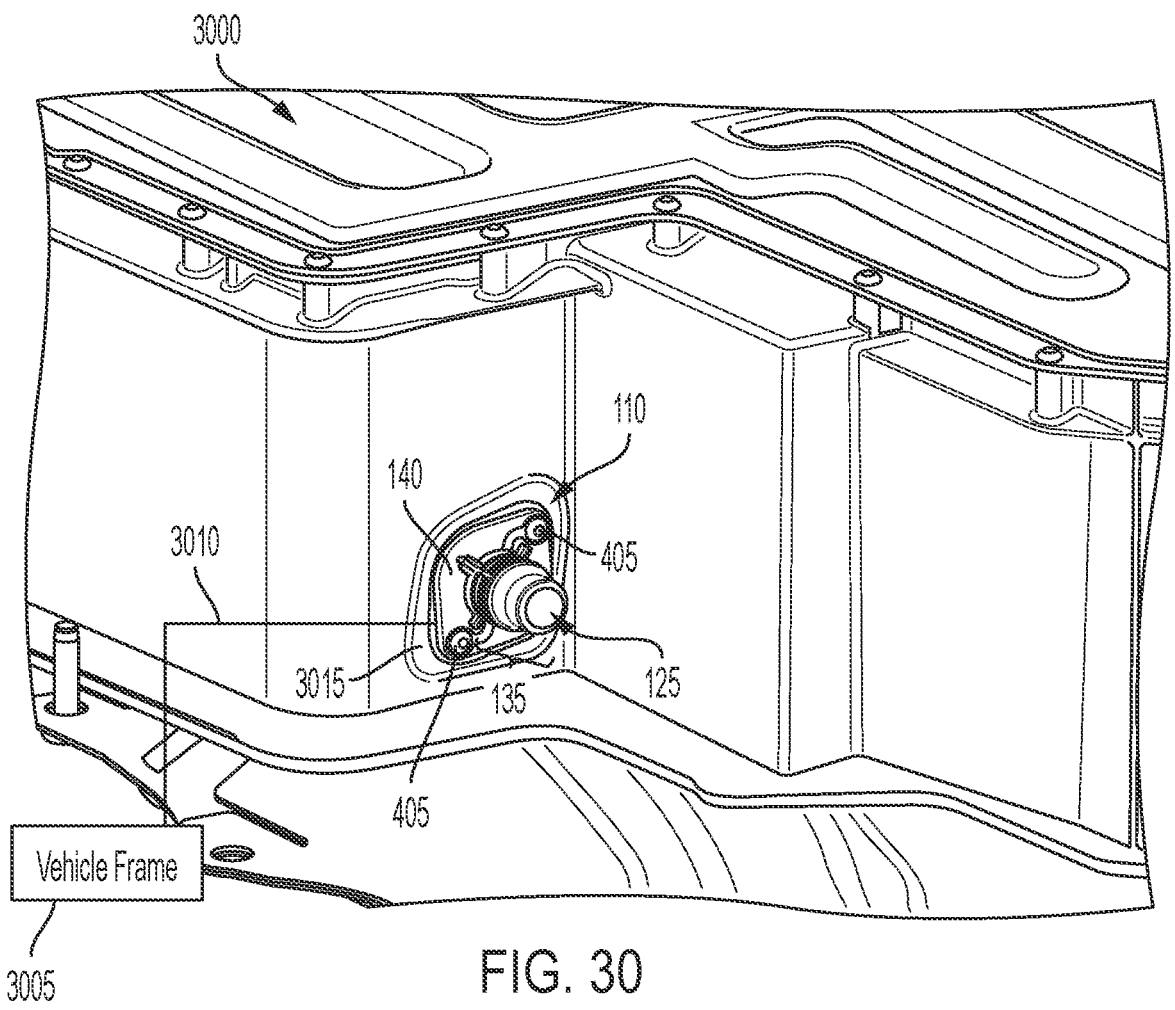
FIG. 30 is an example battery pack including a connector coupled to a wall of the battery pack.

Referring now to FIG. 30, a battery pack 3000 including the connector 110 coupled to a wall 3015 of the battery pack 3000 is shown. The connector 110 can be coupled to an outer side of the wall 3015. The connector 110 can be inserted into the receiver 115 through an opening in the wall 3015. The receiver 115 can be coupled to the wall 3015. At least one connecting component 405 can fix the connector 110 to the wall 3015 and the receiver 115. The wall 140 and the portion 135 can be disposed on an outer side of the wall 3015 outside the battery pack 3000. The portion 160 of the connector 110 can be disposed on an inner side of the wall 3015 inside the battery pack 3000.

At least one conductor 3010 can run from the connector 110 to a vehicle component 3005. The vehicle frame 3005 can ground the conductor 3010 and any other component electrically coupled to the conductor 3010. The conductor 3010 can be or include a wire, a PCB trace, a screw, a bolt, a nut, an enclosure, or any other conductive element or component. The conductor 3010 can be electrically coupled to a conductive body 120 and the fluid within the channel 125. The conductor 3010 can be electrically coupled to the conductor 127 that traverses the channel 125 to electrically couple with the fluid within the channel 125.

Figure 31:
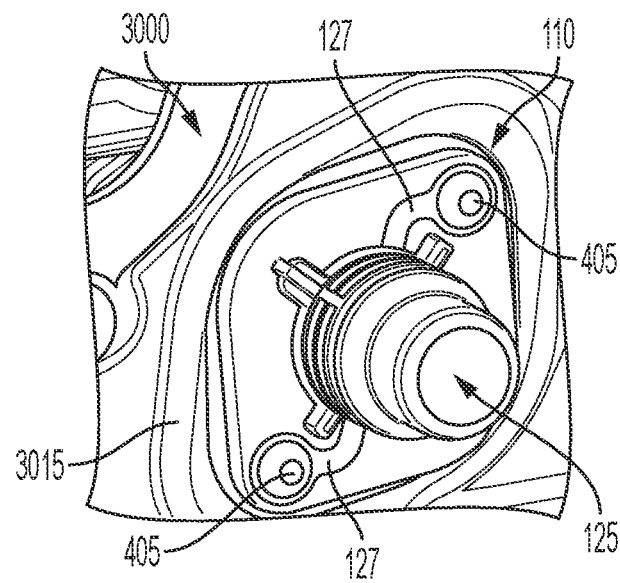
FIG. 31 is an example battery pack including a connector coupled to a wall of a battery pack.

Referring now to FIG. 31, the battery pack 3000 including the connector 110 coupled to a wall 3015 of the battery pack 3000 is shown. The connector 110 can include the conductor 127 traversing the channel 125 and electrically coupling with the connecting components 405. The connecting components 405 can be coupled to the receiver 115 disposed on an inner side of the wall 3015. The conductor 127 can be electrically coupled to the receiver 115. The receiver 115 can be electrically coupled to the vehicle frame 3005. The fluid of the channel 125 can be grounded to the vehicle frame 3005 via the electrical connection between the conductor 127 and the receiver 115 and the electrical connection between the receiver 115 and the vehicle frame 3005.

Figure 32:
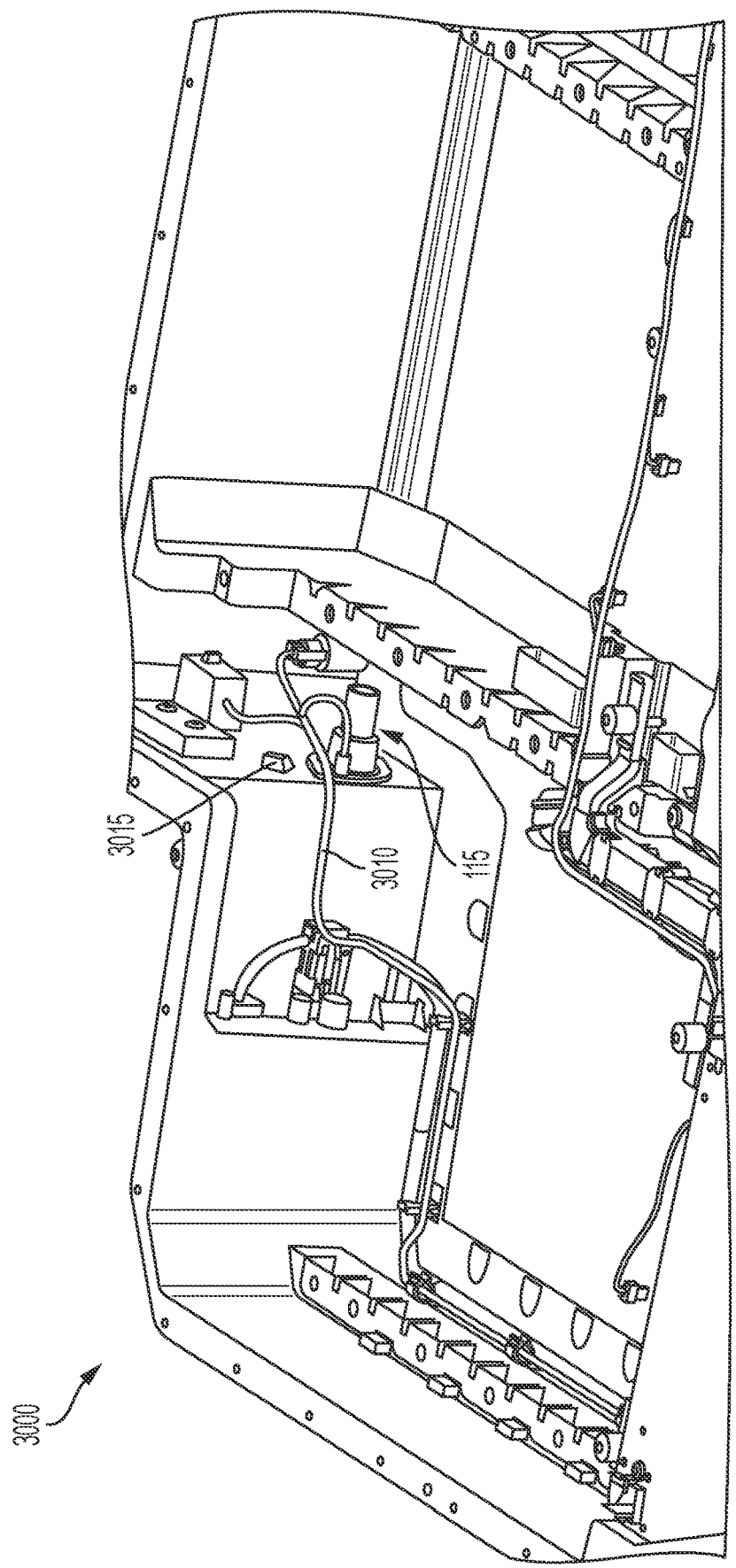
FIG. 32 is an example battery pack including a receiver coupled to a wall of the battery pack and electrically coupled to a ground conductor.

Referring now to FIG. 32, the battery pack 3000 including the receiver 115 coupled to the wall 3015 of the battery pack 3000 and electrically coupled to the conductor 3010 is shown. The receiver 115 can be coupled or fixed to an inner side of the wall 3015. The receiver 115 can be fixed to the inner side of the wall 3015 via an adhesive or via at least one connecting component 405. The receiver 115 can be molded or welded into the wall 3015. The conductor 3010 can be at least partially disposed within the battery pack 3000. The conductor 3010 can be or include a cable that includes a positive or hot wire, a negative or ground wire, or at least one data communication wire. The receiver 115 can be electrically coupled to the conductor 3010. For example, the receiver 115 can be electrically coupled to a ground wire of the conductor 3010. The conductor 3010 can be electrically coupled to the vehicle frame 3005 and can ground the receiver 115, and any component electrically coupled to the receiver 115.

Figure 33:
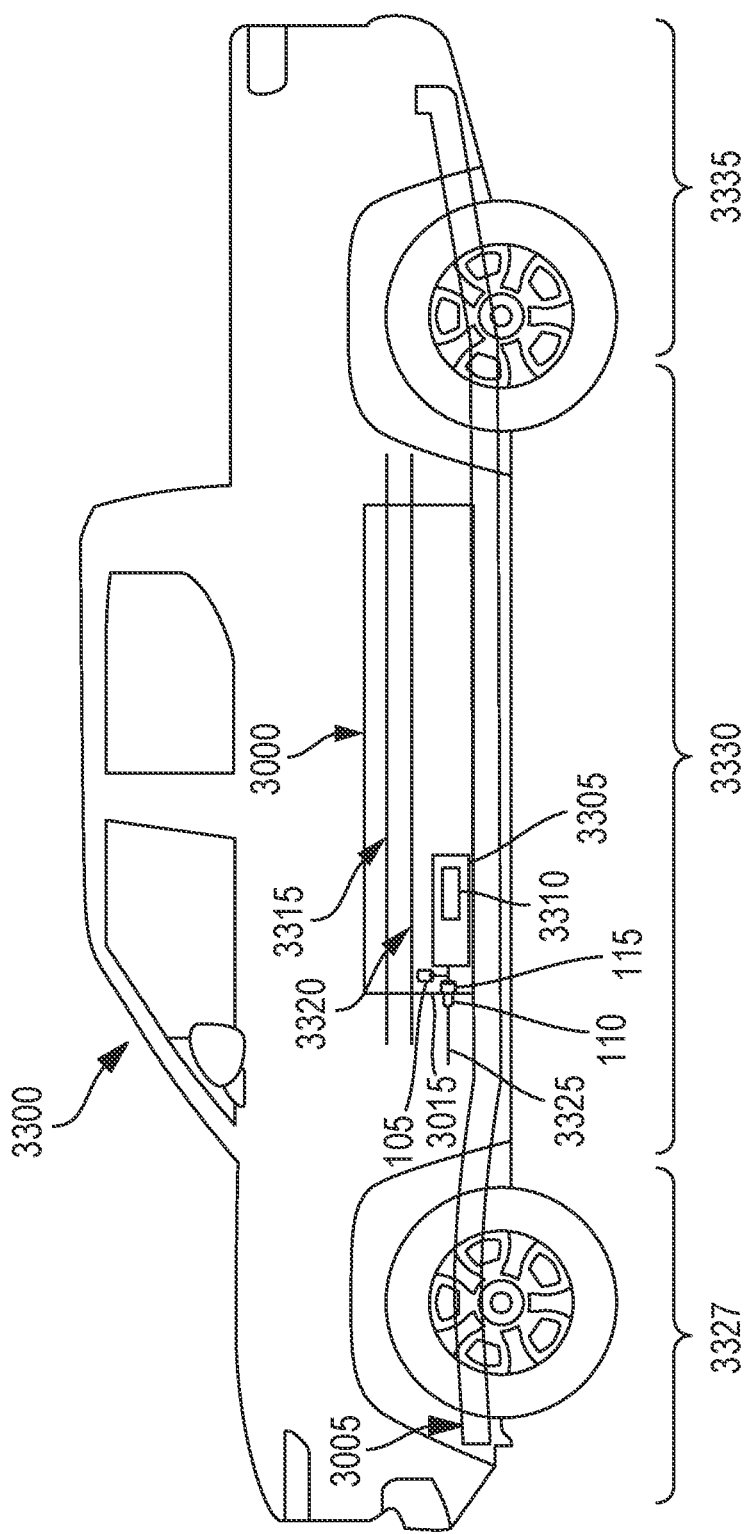
FIG. 33 is an example vehicle including a battery pack including a connector, a receiver, and a sensor.

FIG. 33 depicts an example vehicle 3300 including the battery pack 3000 including the connector 110, the receiver 115, and the sensor 105. FIG. 33 provides a cross-sectional view of the vehicle 3300. The vehicle 3300, such as an electric vehicle, can be installed with at least one battery pack 3000. Electric vehicles 3300 can include electric trucks, electric sport utility vehicles (SUVs), electric delivery vans, electric automobiles, electric cars, electric motorcycles, electric scooters, electric passenger vehicles, electric passenger or commercial trucks, hybrid vehicles, or other vehicles such as sea or air transport vehicles, planes, helicopters, submarines, boats, or drones, among other possibilities. The battery pack 3000 can also be used as an energy storage system to power a building, such as a residential home or commercial building. Electric vehicles 3300 can be fully electric or partially electric (e.g., plug-in hybrid) and further, electric vehicles 3300 can be fully autonomous, partially autonomous, or unmanned. Electric vehicles 3300 can also be human operated or non-autonomous. Electric vehicles 3300 such as electric trucks or automobiles can include on-board battery packs 3000, batteries 3305, or battery modules 3305, or battery cells 3310 to power the electric vehicles 3300.

The electric vehicle 3300 can include a chassis 3005 (e.g., a frame, internal frame, or support structure). The chassis 3005 can support various components of the electric vehicle 3300. The chassis 3005 can span a front portion 3327 (e.g., a hood or bonnet portion), a body portion 3330, and a rear portion 3335 (e.g., a trunk, payload, or boot portion) of the electric vehicle 3300. The battery pack 3000 can be installed or placed within the electric vehicle 3300. For example, the battery pack 3000 can be installed on the chassis 3005 of the electric vehicle 3300 within one or more of the front portion 3327, the body portion 3330, or the rear portion 3335. The battery pack 3000 can include or connect with at least one busbar, e.g., a current collector element. For example, the first busbar 3315 and the second busbar 3320 can include electrically conductive material to connect or otherwise electrically couple the battery 3305, the battery modules 3305, or the battery cells 3310 with other electrical components of the electric vehicle 3300 to provide electrical power to various systems or components of the electric vehicle 3300.

The connector 110 and the receiver 115 can be coupled to the wall 3015 of the battery pack 3000. The connector 110 can be disposed on an outer surface of the wall 3015 and at least the portion 160 can extend through the wall 3015 to couple with the receiver. The portion 160 can extend through an opening or hole in the wall 3015 in order to carry fluid into the battery pack 3000 or out of the battery pack 3000. The receiver 115 can be disposed on an inner surface of the wall 3015. Furthermore, the sensor 105 can be disposed within the battery pack 3000 and coupled to the receiver 115. At least one channel 3325 can carry, transport, or contain fluid that is transported to or from the receiver 115. The channel 3325 can be a pipe, a tube, a tubular passenger, or a medium to carry the fluid. The battery pack 3000 can include at least one channel 3325 that transports the fluid from the receiver to the sensor 105 (e.g., the connector 195) or to thermal components such as cold plates that that cool the batteries 3305, battery modules 3305, or battery cells 3310.

Figure 34:
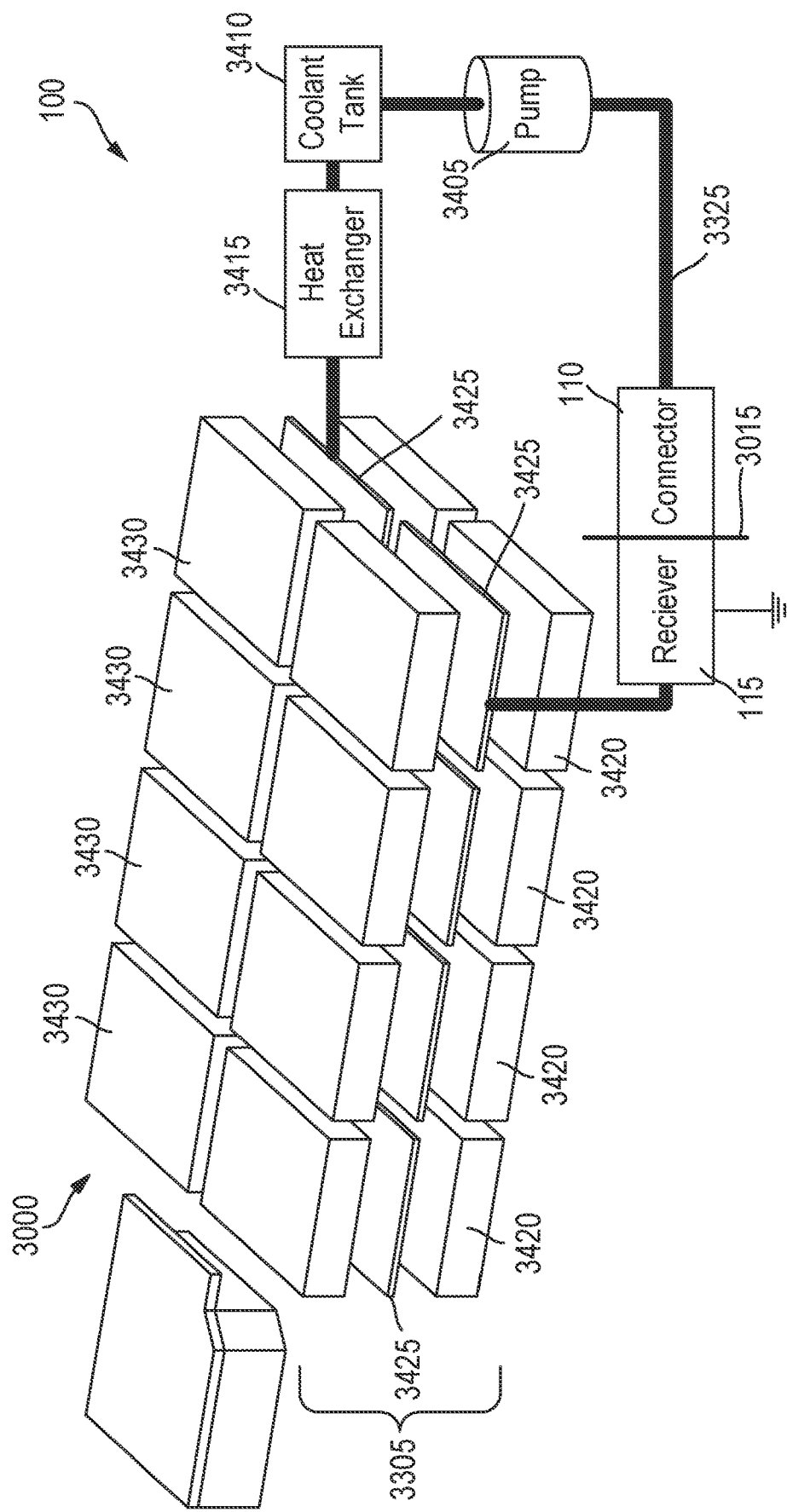
FIG. 34 is an example battery pack of a vehicle connected with an example thermal system grounded via a liquid of the thermal system.

Referring now to FIG. 34, the battery pack 3000 of the vehicle 3300 and a thermal system 100 grounded via a liquid of the thermal system 100 is shown. FIG. 34 provides a cross sectional view of the battery pack 3000 including the battery modules 3305. The battery modules 3305 can include at least one submodule. For example, the battery modules 3420 can include at least one first (e.g., top) submodule 3430 or at least one second (e.g., bottom) submodule 3420. At least one thermal component 3425 can be disposed between the top submodule 3430 and the bottom submodule 3420. For example, one thermal component 3425 (e.g., cold plate) can be configured for heat exchange with one battery module 3305. The thermal component 3425 can be disposed or thermally coupled between the top submodule 3430 and the bottom submodule 3420. One thermal component 3425 can also be thermally coupled with more than one battery module 3305.

The thermal components 3425 shown adjacent to each other can be combined into a single thermal component 3425 that spans the size of one or more submodules 3420 or 3430. The thermal component 3425 can be positioned underneath submodule 3420 and over submodule 3430, in between submodules 3430 and 3420, on one or more sides of submodules 3420, 3430, among other possibilities. The thermal component 3425 can be disposed in sidewalls, cross members, structural beams, among various other components of the battery pack, such as battery pack 3000 described above. The battery submodules 3430, 3420 can collectively form one battery module 3305. In some examples each submodule 3430, 3420 can be considered as a complete battery module 3305, rather than a submodule.

The battery modules 3305 can each include a plurality of battery cells 3310. The battery modules 3305 can be disposed within a housing of the battery pack 3000. The battery modules 3305 can include battery cells 3310 that are cylindrical cells or prismatic cells, for example. The battery module 3305 can operate as a modular unit of battery cells 3310. For example, a battery module 3305 can collect current or electrical power from the battery cells 3310 that are included in the battery module 3305 and can provide the current or electrical power as output from the battery pack 3000. The battery pack 3000 can include any number of battery modules 3305. For example, the battery pack can have one, two, three, four, five, six, seven, eight, nine, ten, eleven, twelve or other number of battery modules 3305 disposed in the housing of the battery pack 3000. It should also be noted that each battery module 3305 may include a top submodule 3430 and a bottom submodule 3420, possibly with a thermal component 3425 in between the top submodule 3430 and the bottom submodule 3420.

The battery pack 3000 can include or define a plurality of areas for positioning of the battery module 3305 and/or cells 3310. The battery modules 3305 can be square, rectangular, circular, triangular, symmetrical, or asymmetrical. In some examples, battery modules 3305 may be different shapes, such that some battery modules 3305 are rectangular but other battery modules 3305 are square shaped, among other possibilities. The battery module 3305 can include or define a plurality of slots, holders, or containers for a plurality of battery cells 3310. It should be noted the illustrations and descriptions herein are provided for example purposes and should not be interpreted as limiting. For example, the battery cells 3310 can be inserted in the battery pack 3000 without battery modules 3305. The battery cells 3310 can be disposed in the battery pack 3000 in a cell-to-pack configuration without modules 3305, among other possibilities.

The battery pack 3000 can be coupled with a thermal system 100. The thermal system 100 can be a cooling system dedicated for cooling the battery modules 3305 or submodules 3420 of the battery pack 3000. The thermal system 100 can be a cooling system dedicated for cooling components of the vehicle 3300, e.g., drives, battery packs, battery cells, battery modules, high voltage distribution boxes, brakes, or other heat generating components of the vehicle 3300. The thermal system 100 can include lines 3325. The lines 3325 can be a plastic or metal tube, channel, or pipe that transports coolant between components of the thermal system 100. The thermal system 100 can deliver liquid, such as coolant, to the battery pack 3000 via the lines 3325. The thermal system 100 can receive the coolant from the battery pack 3000 via the lines 3325. For example, the thermal system 100 can receive coolant from the cold plates 3425. The cold plates 3425 can be part of, or separate from, the thermal system 100.

The thermal system 100 can include at least one heat exchanger 3415. The heat exchanger 3415 can dissipate heat generated at the thermal components 3425 to an outside surrounding. The heat exchanger 3415 can be a radiator. The heat exchanger 3415 can carry the coolant through at least one channel, e.g., tubes or tunnels in a material. The channels can wind, zig-zag, or form another shape. An airflow can be provided over the heat exchanger 3415 to transfer heat from the coolant into the airflow via convection. The airflow can be created through one or more fans configured to blow air over the heat exchanger 3415. The airflow can be created through a motion of the vehicle 3300.

The line 3325 can transport the coolant from the heat exchanger 3415 into at least one coolant tank 3410 that stores a reservoir of coolant. The coolant tank 3410 can be an accumulator that stores excess coolant. The coolant tank 3410 can store the coolant until the coolant is pumped back to the cold plates 3425. The thermal system 100 can include at least one pump 3405 that can pump the coolant from the coolant tank 3410, via a line 3325, into the thermal component 3425. The pump 3405 can be a centrifugal pump, a vertical centrifugal pump, a horizontal centrifugal pump, a diaphragm pump.

A line 3325 can carry the coolant from the pump 3405 to the connector 110. The connector 110 can connect with a receiver 115 through an opening in the wall 3015 of the battery pack 3000. The receiver 115 can be electrically coupled to a ground of the vehicle 3300, such as the vehicle frame 3005. The receiver 115 can be electrically coupled with the conductor 127 of the connector 110 and can ground the thermal system 100 via the coolant transported by the thermal system 100. The receiver 115 can couple with a first thermal component 3425 via the line 3325. The thermal components 3425 can be connected together in series or in parallel to receive coolant from the receiver 115 via at least one line 3325 internal to the battery pack 3000. At least one thermal component 3425 can discharge the coolant from the battery pack 3000 to the heat exchanger 3415 or another component of the thermal system 100 external to the battery pack 3000.

Because the coolant passes through the thermal components 3425, the heat exchanger 3415, the coolant tank 3410, and the pump 3405, all of which may be partially or fully constructed out of a conductive material, the thermal components 3425, the heat exchanger 3415, the coolant tank 3410, or the pump 3405 can be grounded via the coolant. Furthermore, any component in electrical connection with any of the components of the thermal system 100 can be grounded via the coolant. For example, the battery cells 3310, the battery submodules 3420, or the battery modules 3305 can be electrically coupled with the thermal components 3425 and at least partially grounded by the coolant.

Figure 35:
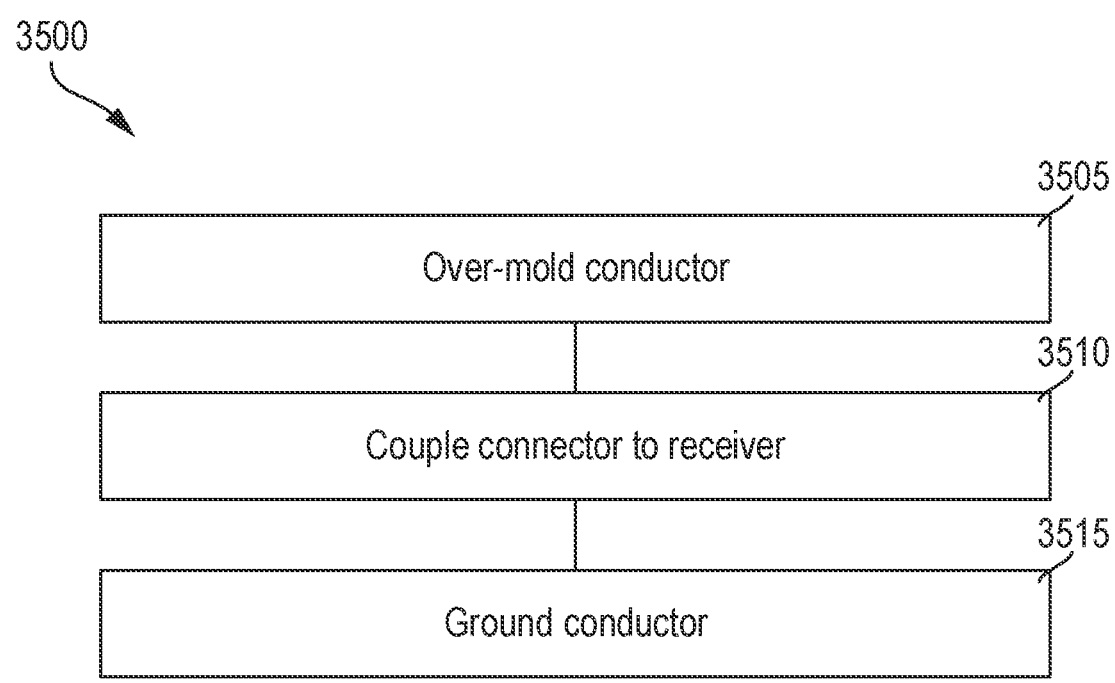
FIG. 35 is an example method of providing a connector that grounds a thermal system via a liquid of the thermal system.

Referring now to FIG. 35, a method 3500 of providing the conductor 127 for the connector 110 to ground the thermal system 100 via a liquid of the thermal system 100 is shown. At least a portion of one ACT of the method 3500 can be performed by a manufacturing or assembly apparatus. At least a portion of one ACT of the method 3500 can be performed by a manufacturing or assembly individual. At least a portion of one ACT of the method 3500 can be performed the connector 110, the receiver 115, or the thermal system 100. At least a portion of one ACT of the method 3500 can be performed by a vehicle. The method 3500 can include an ACT 3505 of over-molding a conductor. The method 3500 can include an ACT 3510 of coupling a connector to a receiver. The method 3500 can include an ACT 3515 of grounding a conductor.

The method 3500 can include the ACT 3505 of over-molding the conductor 127. The conductor 127 can be molded in a cast. The conductor 127 can be inserted into the cast before a liquid is poured or injected into the cast. When the liquid is poured or injected into the cast, a least a portion of the conductor 127 can be molded into a body 120 of the connector 110. The conductor 127 can be positioned within the cast to traverse the channel 125 formed within the connector 110 when the connector 110 is molded. The conductor 127 can be positioned within the cast to be over-molded within the wall 140 of the connector 110. The conductor 127 can be positioned within the cast to traverse the body 120. For example, the conductor 127 can extend from within the channel 125 to outside the channel 125. The conductor 127 can extend past an outer surface 145 of the connector 110. The conductor 127 can extend to a connecting component 405 of the connector 110.

The method 3500 can include an ACT 3510 of coupling the connector 110 to the receiver 115. The portion 160 of the connector 110 can be inserted through an opening in the wall 3015 and into the opening 165 of the receiver 115. The connecting components 405 can be inserted into the wall 3015 though openings in the wall 3015. The connecting components 405 can fix the connector 110 to the receiver 115. The conductor 127 can include a portion 1920 that can include features 510. The connecting components 405 can apply a compressing force to the portion 1920 pushing the features 510 of the portion 1920 into the surface 605 of the receiver 115. This compressing force can cause the features 510 to remove a coating from the surface 605 and electrically couple the features 510 and the conductor 127 to the receiver 115.

The wall 140 itself can include features 510 on the surface 505 facing the surface 605 of the receiver 115. The compressing force that the connecting components 405 apply to the connector 110 and the receiver 115 can cause the features 510 of the wall 140 to remove a coating from the surface 605 and electrically couple the features 510 and the wall 140 to the receiver. The compression limiter 705 can be electrically coupled to the wall 140 of the connector 110 or electrically coupled to the conductor 127. The compression limiter 705 can include features 510. When the connecting components 405 apply a compressing force between the connector 110 and the receiver 115, the features 510 of the compression limiter 705 can remove a coating from the surface 605 and electrically couple the features 510 and the wall 140 to the receiver.

The connector 110 can include a conductor 2405 and is part of, or separate from, the conductor 127. The conductor 2405 can be electrically coupled to the conductor 127. The conductor 127 can traverse the channel 125 and electrically couple with the fluid. The conductor 2405 may or may not traverse the channel 125 but can be electrically coupled with the fluid through the conductor 127 The conductor 2405 can include at least one feature 510 to remove a coating of the receiver 115. For example, a portion 2505 of the conductor 2455 can include features 510 that extend through openings in a portion 2025 of the conductor 127. The portion 2025 of the conductor 127 may include additional features 510 or may only include openings of the features 510 of the conductor 2455 to extend through.

The method 3500 can include an ACT 3515 of grounding the conductor 127. The conductor 127 can traverse the channel 125 and be in contact with the fluid within the channel. The conductor 127 can ground the thermal system 100 by making an electrical connection with the fluid (which may be in electrical connection with at least some of the components of the thermal system 100) and making an electrical connection with a ground of the vehicle 3300. For example, the conductor 127 can be electrically coupled to the receiver 115 via the features 510. At least one conductor 3010 can be electrically couple the receiver 115 to a frame 3005 of the vehicle 3300. Electrically coupling the conductor 3010 to the receiver 115 and to the vehicle frame 3005 can ground the conductor 127 and the thermal system 100.

Figure 36:
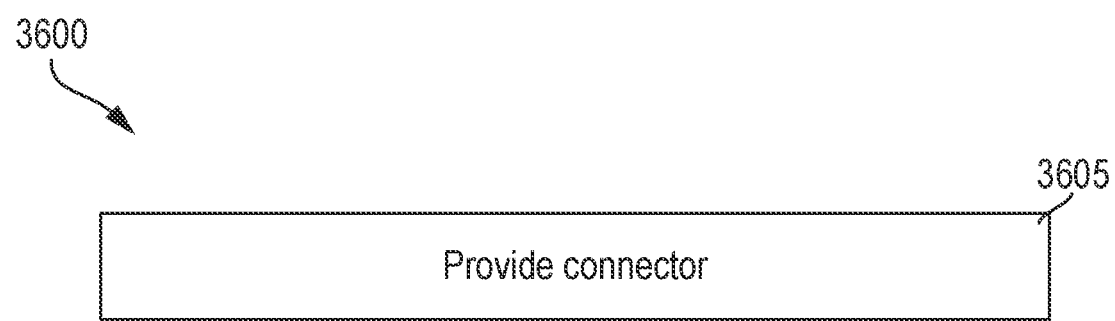
FIG. 36 is an example method of providing a connector.

Referring now to FIG. 36, a method 3600 of providing a connector is shown. The method 3600 can include an ACT 3605 of providing the connector 110. The connector 110 can include the body 120 forming the channel 125. The channel 125 can convey a liquid within the vehicle 3300. For example, the channel 125 can convey liquid of the thermal system 100 into the battery pack 3000 to a thermal component 3425 of the battery pack 3000 or out of the battery pack 3000 from a thermal component 3425 of the battery pack 3000. The connector 110 can include a conductor 127. The conductor 127 can be electrically coupled to a system of the vehicle 3300, such as the frame 3005, to ground the conductor 127. The conductor 127 can traverse the channel 125 to electrically couple with the liquid and ground the liquid or the thermal system 100.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

In some examples, the conductor traversing a channel of the connector to ground the thermal system can be applied to any type of thermal component, such as a receiver, a pipe, a tube, a channel, or other component that forms a channel that liquid can flow through. While the conductor can ground liquid coolant for a thermal system of a vehicle, the conductor can be applied to non-vehicle systems, such as thermal systems to cool computers. Further relative parallel, perpendicular, vertical or other positioning or orientation descriptions include variations within +/−10% or +/−10 degrees of pure vertical, parallel or perpendicular positioning. References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An apparatus, comprising:
   a body comprising a channel, the body to couple with a battery apparatus that powers a vehicle; and
   a conductor electrically coupled to a ground, the conductor comprising a lead into the channel to ground coolant in the channel that cools the battery apparatus.

2. The apparatus of claim 1, wherein:
   the apparatus is a bulkhead fitting; and
   the conductor is over-molded into the bulkhead fitting through injection of a material of the bulkhead fitting into a mold including the conductor, the conductor comprising a ring terminal to ground the coolant via the lead into the coolant.

3. The apparatus of claim 1, comprising:
the body, comprising:
  a conductive material to form the channel, the conductive material to electrically couple with the coolant; and
  at least one component to remove a coating from a receiver to electrically couple the conductive material of the body to the receiver to ground the coolant.

4. The apparatus of claim 1, comprising:
the conductor, comprising:
  a first end disposed within the channel; and
  a second end disposed outside the body to electrically couple with a component to ground the coolant.

5. The apparatus of claim 1, comprising:
the conductor, comprising:
  a first end disposed within the channel; and
  a second end disposed outside the body to electrically couple with a connector;
the connector to fix the apparatus to a receiver to electrically couple the conductor with the receiver and ground the coolant.

6. The apparatus of claim 1, comprising:
the conductor, comprising:
  a first end disposed within the channel; and
  a second end disposed outside the body to electrically couple with a connector;
the connector to fix the apparatus to a receiver, the connector electrically coupled with a compression limiter; and
the compression limiter comprising a component to remove a coating from the receiver to electrically couple the compression limiter to the receiver to ground the coolant.

7. The apparatus of claim 1, comprising:
the conductor comprising a curved portion, the curved portion extending around only a portion of an outer circumference of the channel.

8. The apparatus of claim 1, comprising:
the conductor comprising a curved portion, the curved portion completely extending around an outer circumference of the channel.

9. The apparatus of claim 1, comprising:
the conductor comprising at least one of:
  a prismatic shaped component to remove a coating from a receiver to electrically couple the conductor to the receiver to ground the coolant;
  a triangular solid shaped component to remove the coating from the receiver to electrically couple the conductor to the receiver to ground the coolant; or
  a component punched from a surface of the conductor, at least one side of the component attached to the surface and at least two sides of the component free from the surface, the component to remove the coating from the receiver to electrically couple the conductor to the receiver to ground the coolant.

10. The apparatus of claim 1, comprising:
the conductor comprising:
  a first prismatic shaped component punched from a surface of the conductor to remove a coating from a receiver to electrically couple the conductor to the receiver to ground the coolant, at least one side of the first prismatic shaped component attached to the surface; and
  a second prismatic shaped component extending through an opening of the surface of the conductor to remove the coating from the receiver to electrically couple the conductor to the receiver to ground the coolant.

11. The apparatus of claim 1, comprising:
the body, comprising:
  a wall that extends radially from an outer circumference of the channel a first distance;
  a cylindrical portion that extends from the wall along a longitudinal axis of the channel to form a portion of the channel;
  the conductor that extends radially from the outer circumference of the channel through the cylindrical portion a second distance less than the first distance;
  a portion of the conductor outside of an outer surface of the cylindrical portion to remove a coating from a receiver to electrically couple the conductor to the receiver to ground the coolant.

12. A thermal management system, comprising:
a connector, comprising:
  a body comprising a channel, the body to couple with a battery apparatus that powers a vehicle; and
  a conductor electrically coupled to a ground, the conductor comprising a lead into the channel to ground coolant in the channel to cool the battery apparatus.

13. The thermal management system of claim 12, comprising:
the conductor, comprising:
  a first end disposed within the channel; and
  a second end disposed outside the body to electrically couple with a component to ground the coolant.

14. The thermal management system of claim 12, comprising:
the conductor comprising a curved portion, the curved portion completely extending around an outer circumference of the channel.

15. The thermal management system of claim 12, comprising:
the conductor comprising:
  a first prismatic shaped component punched from a surface of the conductor to remove a coating from a receiver to electrically couple the conductor to the receiver to ground the thermal management system, at least one side of the first prismatic shaped component attached to the surface; and
  a second prismatic shaped component extending through an opening of the surface of the conductor to remove the coating from the receiver to electrically couple the conductor to the receiver to ground the thermal management system.

16. The thermal management system of claim 12, comprising:
the conductor over-molded within the body through injection of a material of the body into a mold including the conductor.

17. The thermal management system of claim 12, wherein:
the connector is a bulkhead fitting; and
the conductor is over-molded into the bulkhead fitting through injection of a material of the bulkhead fitting into a mold including the conductor, the conductor comprising a ring terminal to ground the coolant via the lead into the coolant.

18. A sensor, comprising:
a body that extends into a channel, the body to couple with a battery apparatus that powers a vehicle; and a conductor coupled to the body and electrically coupled to a ground, the conductor traverses the channel to ground coolant in the channel to cool the battery apparatus.

19. The sensor of claim 18, comprising:

the conductor extending through the body of the sensor into the channel to electrically couple with the coolant.

20. The sensor of claim 18, comprising:

at least a portion of the body to electrically couple to the coolant and electrically couple to a retaining ring;

the retaining ring to fix the sensor to a receiver of the channel; and the conductor to electrically couple to the retaining ring to ground the coolant.

* * * * *